United States Patent
Sankin et al.

(10) Patent No.: US 8,017,981 B2
(45) Date of Patent: *Sep. 13, 2011

(54) NORMALLY-OFF INTEGRATED JFET POWER SWITCHES IN WIDE BANDGAP SEMICONDUCTORS AND METHODS OF MAKING

(75) Inventors: Igor Sankin, Perrysburg, OH (US); Joseph Neil Merrett, Starkville, MS (US)

(73) Assignee: SemiSouth Laboratories, Inc., Starkville, MS (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/826,033

(22) Filed: Jun. 29, 2010

(65) Prior Publication Data

US 2010/0295102 A1  Nov. 25, 2010

Related U.S. Application Data

(60) Division of application No. 11/822,568, filed on Jul. 6, 2007, now Pat. No. 7,820,511, which is a continuation-in-part of application No. 11/783,224, filed on Apr. 6, 2007, now Pat. No. 7,556,994, which is a continuation of application No. 11/000,222, filed on Dec. 1, 2004, now Pat. No. 7,202,528.

(51) Int. Cl.
  *H01L 27/085* (2006.01)
(52) U.S. Cl. ............... 257/265; 257/E21.445; 435/137; 435/195
(58) Field of Classification Search ............... 257/265, 257/E21.445; 438/137, 195
See application file for complete search history.

(56) References Cited

U.S. PATENT DOCUMENTS

| | | |
|---|---|---|
| 3,767,946 A | 10/1973 | Berger et al. |
| 4,107,725 A | 8/1978 | Yoshida et al. |
| 4,587,712 A | 5/1986 | Baliga |
| 4,663,547 A | 5/1987 | Baliga et al. |
| 4,945,394 A | 7/1990 | Palmour et al. |
| 5,264,713 A | 11/1993 | Palmour |
| 5,345,097 A | 9/1994 | Nakagawa |
| 5,391,895 A | 2/1995 | Dreifus |
| 5,396,085 A | 3/1995 | Baliga |
| 5,406,096 A | 4/1995 | Malhi |

(Continued)

FOREIGN PATENT DOCUMENTS

EP    0577498 A1    1/1994

(Continued)

OTHER PUBLICATIONS

Xie et al., "Monolithic NMOS Digital Integrated Circuits in 6H-SiC," IEEE Electron Device Letters, vol. 15, No. 11, 1994, pp. 455-457.

(Continued)

*Primary Examiner* — Wael Fahmy
*Assistant Examiner* — John C Ingham
(74) *Attorney, Agent, or Firm* — Morris, Manning & Martin, LLP; Christopher W. Raimund

(57) ABSTRACT

Wide bandgap semiconductor devices including normally-off VJFET integrated power switches are described. The power switches can be implemented monolithically or hybridly, and may be integrated with a control circuit built in a single- or multi-chip wide bandgap power semiconductor module. The devices can be used in high-power, temperature-tolerant and radiation-resistant electronics components. Methods of making the devices are also described.

24 Claims, 30 Drawing Sheets

U.S. PATENT DOCUMENTS

| | | | |
|---|---|---|---|
| 5,610,085 | A | 3/1997 | Yuan et al. |
| 5,710,455 | A | 1/1998 | Bhatnagar et al. |
| 5,798,539 | A | 8/1998 | Jorke |
| 5,945,701 | A | 8/1999 | Siergiej et al. |
| 6,156,611 | A | 12/2000 | Lan et al. |
| 6,344,663 | B1 | 2/2002 | Slater, Jr. et al. |
| 6,503,782 | B2 | 1/2003 | Casady et al. |
| 6,545,297 | B1 | 4/2003 | Noble, Jr. et al. |
| 6,600,192 | B1 | 7/2003 | Sugawara et al. |
| 6,693,322 | B2 | 2/2004 | Friedrichs et al. |
| 6,767,783 | B2 | 7/2004 | Casady et al. |
| 6,841,812 | B2 | 1/2005 | Zhao |
| 6,943,407 | B2 | 9/2005 | Ouyang et al. |
| 6,958,275 | B2 | 10/2005 | Metzler |
| 7,009,209 | B2 | 3/2006 | Casady et al. |
| 7,119,380 | B2 | 10/2006 | Sankin |
| 7,202,528 | B2 * | 4/2007 | Sankin et al. ............... 257/341 |
| 7,241,694 | B2 | 7/2007 | Takeuchi et al. |
| 7,556,994 | B2 | 7/2009 | Sankin et al. |
| 2002/0149021 | A1 | 10/2002 | Casady et al. |
| 2002/0192894 | A1 | 12/2002 | Kalnitsky et al. |
| 2003/0042538 | A1 | 3/2003 | Kumar et al. |
| 2003/0089930 | A1 | 5/2003 | Zhao |
| 2003/0098465 | A1 | 5/2003 | Suzumura et al. |
| 2004/0051136 | A1 | 3/2004 | Kataoka et al. |
| 2005/0067630 | A1 | 3/2005 | Zhao |
| 2007/0085147 | A1 | 4/2007 | Imoto |
| 2007/0243668 | A1 | 10/2007 | Sankin et al. |

FOREIGN PATENT DOCUMENTS

| | | |
|---|---|---|
| JP | 59147467 A | 8/1984 |
| JP | 2000114546 A | 4/2000 |
| JP | 2002076020 A | 3/2002 |
| JP | 2003209263 A | 7/2003 |
| JP | 20060202987 A | 8/2006 |
| WO | 02/37200 A1 | 5/2002 |
| WO | 2006060337 A2 | 6/2006 |

OTHER PUBLICATIONS

Brown et al., "High Temperature Silicon Carbide Planar IC Technology and First Monolithic SiC Operational Amplifier IC," Transactions of 2nd Int. High-Temp. Elec. Conf. (HiTEC), 1994, pp. X1-17-X1-22.e.

Agarwal et al., "Investigation of Lateral RESURF, 6H-SiC MOSFETS," Material Science Forum, vols. 338-342, 2002, pp. 1307-1310.

Agarwal et al., "A Critical Look at the Performance Advantages and Limitations of 4H-SiC Power UMOSFET Structures," Proceedings of 8th International Symposium on Power Semiconductor Devices and ICs, May 23, 1996, pp. 119-122.

Agarwal et al., "Temperature Dependence of Fowler-Nordheim Current in 6H- and 4H-SiC MOS Capacitors," IEEE Electron Device Letters, vol. 18, No. 12, 1997, pp. 592-594.

Sheppard et al., "High Power Hybrid and MMIC Amplifiers Using Wide-Bandgap Semiconductor Devices on Semi-Insurlating SiC Substrates," Digest of 60th Device Research Conference, Jun. 24-26, 2002, pp. 175-178.

Lam et al., "Ion Implant Technology for 6H-SiC MESFETs Digital ICs," Digest of 54th Annual Device Research Conference, Jun. 24-26, 1996, pp. 157-159.

Neudeck et al., "600oC Logic Gates Using Silicon Carbide JFETS," Government Microcircuit Applications Conference co-sponsored by DOD, NASA, DOC, DOE, NSA and CIA, Anaheim, California, Mar. 20-24, 2000.

Merrett et al., "Silicon Carbide Vertical Junction Field Effect Transistors Operated at Junction Temperatures Exceeding 300oC," Proceeding of IMAPS International Conference and Exhibition on High Temperature Electronic (HiTECH), May 17-20, 2004, Sante Fe, NM.

Sugawara et al., "4H-SiC High Power SIJFET Module," IEEE, Apr. 14-17, 2003, pp. 127-130.

Asano et al., "5.5kV Normally-off Low RonS 4h-SiC SEJFET," Proceedings of 2001 International Symposium on Power Semiconductor Devices & ICs, Osaka, 2001, pp. 23-26.

Li et al., "Design of 1.7 to 14kV Normally-off Trenched and Implanted Vertical JFET in 4F-SiC," Materials Science Forum, vols. 457-460, 2004, pp. 1197-1200.

Sankin et al., "On Development of 6H-SiC LDMOS Transistors Using Silane-Ambient Implant Anneal," Solid-State Electronics, Mar. 13, 2001.

Friedrichs et al., "SiC Power Devices with Low On-Resistance for Fast Switching Application," ISPSO, May 22-25, 2000.

European Search Report dated May 17, 2011.

* cited by examiner

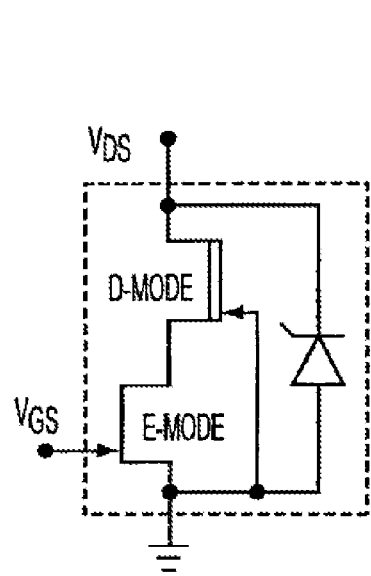
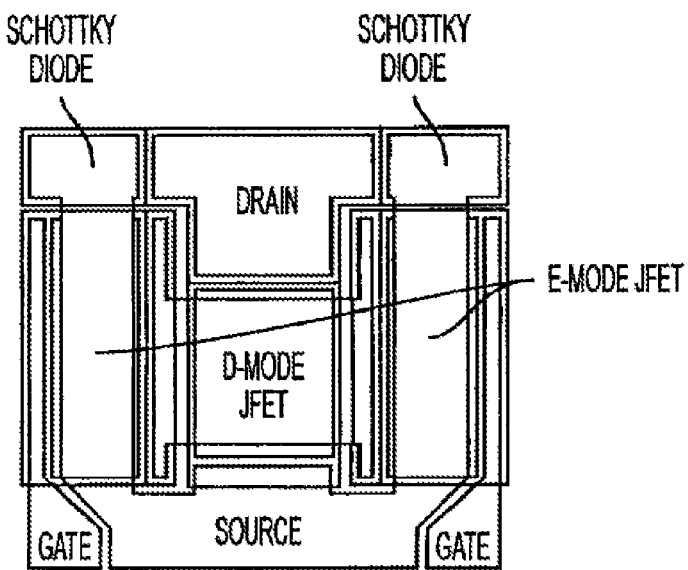
FIG. 5A  FIG. 5B
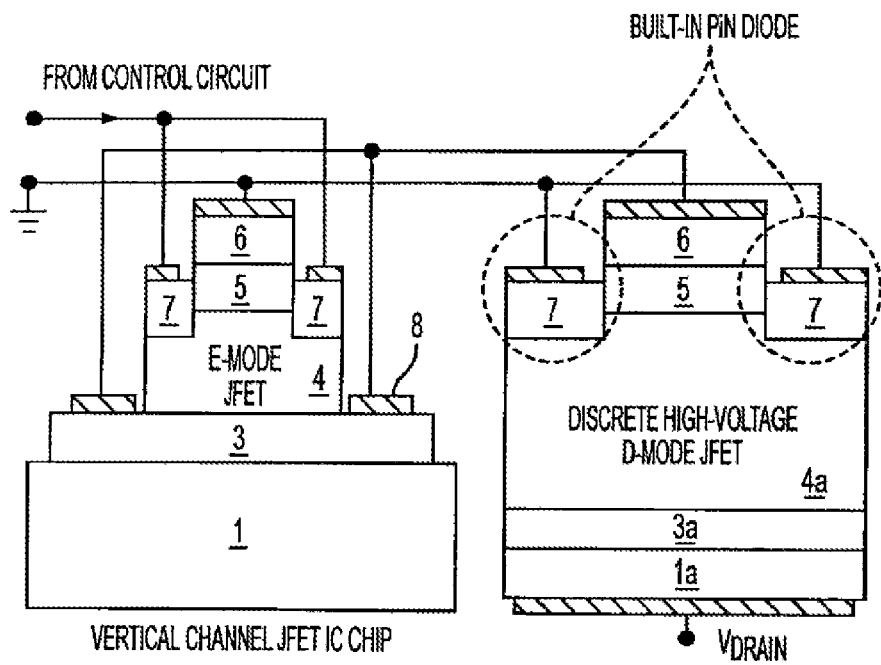
FIG. 6

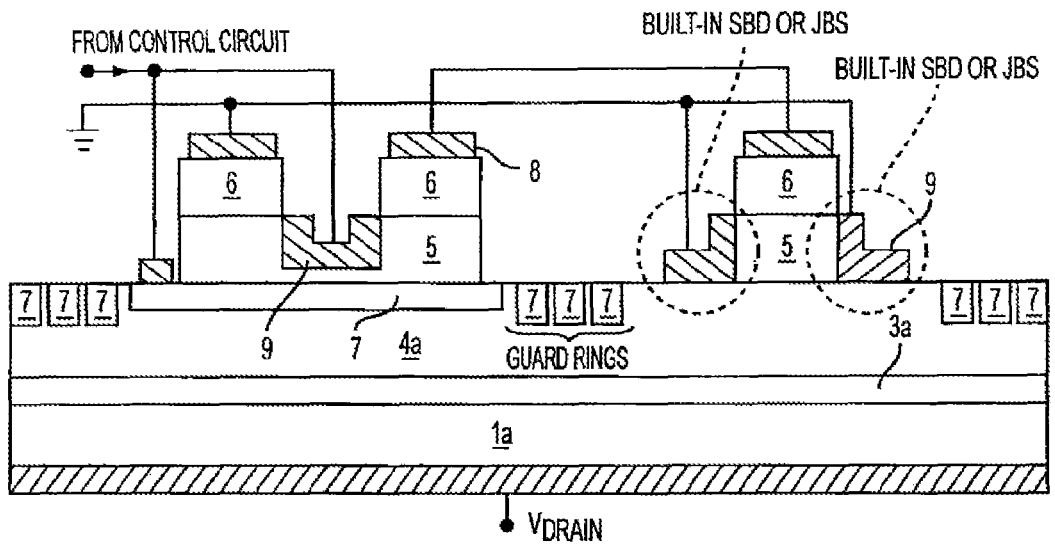
FIG. 17
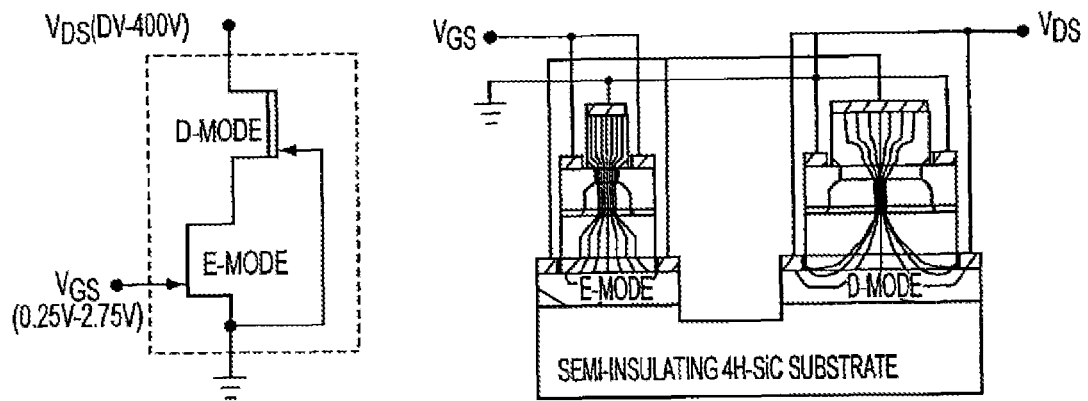
FIG. 18A  FIG. 18B

NORMALLY-OFF INTEGRATED JFET POWER SWITCHES IN WIDE BANDGAP SEMICONDUCTORS AND METHODS OF MAKING

This application is divisional of U.S. patent application Ser. No. 11/822,568, filed Jul. 6, 2007, now allowed, which is a continuation-in-part of U.S. patent application Ser. No. 11/783,224, filed on Apr. 6, 2007, pending, which is a continuation of U.S. patent application Ser. No. 11/000,222, filed on Dec. 1, 2004, now U.S. Pat. No. 7,202,528, which is related to U.S. Patent Application No. 60/585,881, filed Jul. 8, 2004, and U.S. patent application Ser. No. 10/999,954, filed on Dec. 1, 2004, now U.S. Pat. No. 7,119,380. Each of the aforementioned applications is incorporated by reference herein in its entirety.

BACKGROUND

1. Technical Field

The present invention relates generally to field effect transistors (FETs), and in particular, to such transistors formed in wide bandgap semiconductor materials. Further, this invention relates to monolithic and hybrid integrated circuits comprising low-voltage control circuitry and to power switches built using the above transistors.

2. Background of the Technology

Wide bandgap semiconductor materials (with $E_G>2$ eV) such as silicon carbide (SiC) or Group III nitride compound semiconductors (e.g., gallium nitride or GaN) are very attractive for use in high-power, high-temperature, and/or radiation resistant electronics. Monolithic or hybrid integration of a power transistor and control circuitry in a single or multi-chip wide bandgap power semiconductor module is highly desirable for such applications in order to improve the efficiency and reliability of the system.

SiC smart power technology has been a topic of discussion in recent years, but has experienced limited scientific investigation. Proposed solutions have been met with skepticism relating to the operation of both the power switch and control circuitry.

Because of the fundamental differences in material properties and processing technologies, traditional Si or GaAs integrated circuit (IC) technologies such as Complementary Metal-Oxide-Semiconductor (CMOS) or Direct Coupled FET Logic (DCFL) cannot in most cases be easily transferred to wide bandgap semiconductors. Several attempts at fabricating SiC NMOS and CMOS digital and analog ICs have been reported in the last decade (e.g., [1], [2]). A monolithic CMOS integrated device in SiC and method of fabricating the same is disclosed in U.S. Pat. No. 6,344,663, [3]. Moreover, recent development in SiC Lateral DMOS Field-Effect Transistors (LDMOSFETs) (e.g., [4]-[5]) theoretically allow for the monolithic integration of MOSFET-based control circuitry and power switches for use in Smart Power electronics. Various issues, however, limit the use of MOSFET-based SiC integrated circuits in the applications where high-temperature and/or radiation tolerance is required. The first such issue is on-state insulator reliability as a result of a much smaller conduction band offset of SiC to $SiO_2$ as compared to that of silicon. This issue becomes even more significant at high temperatures and in extreme radiation environments. Other issues include: low inversion channel mobility due to high interface state density at the $SiC/SiO_2$ interface and high fixed charge density in the insulator; and significant threshold voltage shift with temperature due to ionization of interface states.

Another transistor candidate for use in SiC Smart Power electronics, a SiC bipolar junction transistor (BJT), also suffers from interface-related issues such as high recombination velocity on the surface between the emitter and the base resulting in low current gain and high control losses.

Another transistor candidate for use in SiC Smart Power electronics is a Metal Semiconductor Field-Effect Transistor (MESFET). Despite the fact the SiC MESFET monolithic microwave integrated circuits (MMICs) received significant development in the last decade (e.g., [6]), there have been few published attempts to build SiC MESFET logic and analog circuits (e.g., [7]).

An alternative to the MOSFET and MESFET approaches is the use of lateral JFET-based integrated circuits implemented in either complementary (n-type and p-type channels as disclosed in U.S. Pat. No. 6,503,782 [8]) or enhanced-depletion (n-type channels) forms. SiC JFETs have proven to be radiation tolerant while demonstrating very insignificant threshold voltage shift with temperature. Encouraging results in the development of high-temperature normally-on power vertical junction field-effect transistors (VJFETs) have been published in recent years (e.g., [9]). However, despite their excellent current-conduction and voltage-blocking capabilities, a major deficiency of these transistors is that they are "normally-on" devices. On the system level, this often requires an additional (negative) supply voltage and short circuit protection.

Several attempts to build normally-off SiC high-voltage VJFET switches have been reported recently. Typically, these devices comprise both lateral and vertical channel regions (e.g., [10]-[12]). These devices, however, exhibit a drastic contradiction between the device blocking capabilities and the specific on-resistance. For example, a VJFET with a 75 μm, $7\times10^{14}$ $cm^{-3}$ n-type drift region was able to block above 5.5 kV at zero gate-to-source voltage [13]. At the same time, this device demonstrated a specific on-resistance ($R_{sp\text{-}on}$) of more then 200 $m\Omega*cm^3$. The intrinsic resistance of its drift layer estimated from its thickness and doping was slightly above 60 $m\Omega*cm^3$, with the remainder of the on-resistance was contributed by the channel regions.

In order to reduce the specific on-resistance of SiC power VJFETs, these devices can be driven in bipolar mode by applying high positive gate-to-source voltage. For example, the device discussed above and disclosed in [13] demonstrated an $R_{sp\text{-}on}$ of 66.7 $m\Omega*cm^3$ when a gate-to-source bias of 5 V was applied [14]. This approach, however, can lead to significant power losses due to high gate current.

Another approach is to use special circuits and methods for controlling normally-on devices so that they can be operated in normally-off mode. A cascode connection of a low-voltage control JFET with a high-voltage JFET wherein the drain of the control JFET is connected to the source of the high-voltage device and the gate of high-voltage JFET is connected to the source of the control JFET has been disclosed in U.S. Pat. No. 3,767,946 [15]. A compound field-effect transistor monolithically implementing such a cascode connection has also been disclosed in U.S. Pat. No. 4,107,725 [16]. Similar types of cascode circuits, where low-voltage normally-off devices control high-voltage normally-on devices are disclosed in U.S. Pat. No. 4,663,547 [17]. More recently, a normally-on SiC VJFET controlled by an Si MOSFET in the above configuration has been reported by several groups (e.g., [18]). This integrated power switch has demonstrated excellent voltage-blocking and current-conducting capabilities, as well as high switching speed. However, the use of silicon MOSFETs for the control of power in normally-on SiC VJFETs significantly limits both the temperature range and the radiation tolerance of the cascode. Accordingly, there is still a need for wide bandgap normally-off power switching device in general, and in particular, for such a power switch integrated with control circuitry built in wide bandgap semiconductors.

SUMMARY

A method is provided which comprises:

positioning a first mask on a layer of n-type semiconductor material, wherein the layer of n-type semiconductor material is on a first layer of p-type semiconductor material and the first layer of p-type semiconductor material is on a substrate;

selectively etching the layer of n-type semiconductor material through openings in the first mask to form an etched region and a raised region having a sidewall adjacent the etched region;

removing the first mask;

epitaxially growing a second layer of p-type semiconductor material on the etched and raised regions of the layer of n-type semiconductor material;

positioning a second mask on the second layer of p-type semiconductor material which masks a portion of the second layer of p-type semiconductor material over the etched region and a portion of the second layer of p-type semiconductor material over the raised region;

selectively etching through the second layer of p-type semiconductor material through openings in the second mask to form at least one raised p-type feature on the etched region and at least one raised p-type feature on the raised region and to selectively expose portions of the underlying layer of n-type semiconductor material adjacent and between the raised p-type features;

optionally, positioning a third mask on an exposed portion of the layer of n-type semiconductor material adjacent the raised p-type feature on the raised region opposite the etched region;

selectively implanting p-type dopants in the exposed underlying n-type semiconductor material to form a first non-implanted region over the etched region, a second non-implanted region over the raised region and n-type implanted regions in the layer of n-type semiconductor material;

removing the second mask;

forming ohmic contacts on the raised p-type features and on the implanted regions in the layer of n-type semiconductor material.

A method is provided which comprises:

positioning a first mask on a first layer of n-type semiconductor material, wherein the first layer is on a substrate;

using the first mask, selectively implanting p-type dopants in the first layer to form a p-type implanted region adjacent a non-implanted region in the first layer;

removing the first mask;

epitaxially growing a third layer of n-type semiconductor material on the first layer;

epitaxially growing a fourth layer of n-type semiconductor type material on the third layer;

positioning a second mask on the fourth layer;

selectively etching through the fourth layer to expose underlying third layer through openings in the second mask thereby forming raised features of n-type semiconductor material over the p-type implanted region of the first layer and one or more raised features of n-type semiconductor material over the non-implanted region of the first layer;

implanting p-type dopants in the third layer through openings in the second mask to form p-type implanted regions in the third layer between and adjacent the raised features of n-type semiconductor material;

removing the second mask;

positioning a third mask which masks the raised features and the area between the raised features over the p-type implanted region of the first layer and which masks the one or more raised features over the non-implanted region of the first layer and areas adjacent thereto;

using the third mask, selectively etching through the third layer to expose p-type implanted and non-implanted regions of the underlying first layer thereby forming first and second raised structures, wherein the first raised structure comprises the raised features over the p-type implanted region of the first layer and the p-type implanted region of the third layer therebetween and wherein the second raised structure comprises the one or more raised features over the non-implanted region of the first layer and p-type implanted regions of the third layer adjacent thereto;

removing the third mask;

positioning a fourth mask covering the first and second raised structures and a region of p-type implanted first layer adjacent the first raised structure;

using the fourth mask, selectively etching through the p-type implanted region in the first layer of n-type semiconductor material adjacent to and between the first and second raised structures;

removing the fourth mask forming ohmic contacts on exposed surfaces of the raised features of n-type semiconductor material and on exposed p-type implanted regions.

A method is provided which comprises:

positioning a first mask on a first layer of n-type semiconductor material, wherein the first layer is on a substrate;

using the first mask, selectively implanting p-type dopants in the first layer of n-type semiconductor material to form a p-type implanted region adjacent a non-implanted region in the first layer;

removing the first mask;

epitaxially growing a third layer of n-type semiconductor material on the first layer;

epitaxially growing a fourth layer of n-type semiconductor type material on the third layer;

positioning a second mask on the fourth layer;

selectively etching through the fourth layer to expose underlying third layer through openings in the second mask thereby forming raised features of n-type semiconductor material over the p-type implanted region of the first layer and one or more raised features of n-type semiconductor material over the non-implanted region of the first layer;

removing the second mask;

positioning a third mask which masks the raised features and the area between the raised features over the p-type implanted region of the first layer and which masks the raised feature over the non-implanted region of the first layer;

using the third mask, selectively etching through the third layer to expose p-type implanted and non-implanted regions of the underlying first layer thereby forming first and second raised structures, the first raised structure comprising the raised features over the p-type implanted region of the first layer and the region of the third layer therebetween and the second raised structure comprising the raised feature over the non-implanted region of the first layer, the second raised structure having sidewalls;

removing the third mask;

forming ohmic contacts on exposed surfaces of the raised features of n-type semiconductor material and on the exposed p-type implanted region of the first layer; and forming Schottky contacts on the third layer between the raised features over the p-type implanted region, on the non-implanted portion of the first layer adjacent the second raised structure and on material of the third layer on the sidewalls of the second raised structure.

A monolithic integrated circuit is provided which comprises a lateral junction field effect transistor and a vertical junction field effect transistor;

the lateral junction field effect transistor comprising:
a buffer layer of a p-type semiconductor material formed in a portion of a first major surface of a drift layer;
a channel layer of an n-type semiconductor material on and non-coextensive with the buffer layer such that a portion of the buffer layer is exposed;
discrete source and drain regions of an n-type semiconductor material in spaced relation on the channel layer;
a gate region of a p-type semiconductor material formed in the channel layer between the source and drain regions and forming a rectifying junction with the channel layer;
ohmic contacts on the source region, the gate region, the drain region and on the exposed portion of the buffer layer;

the vertical junction field effect transistor comprising:
a channel layer of an n-type semiconductor material on the first major surface of the drift layer laterally spaced from the buffer layer;
one or more discrete source regions of an n-type semiconductor material in spaced relation on the channel layer;
a gate region of a p-type semiconductor material formed in the channel layer adjacent the one or more source regions and forming a rectifying junction with the channel layer; and
ohmic contacts on the gate and source regions;

wherein the drift layer is on a first major surface of a substrate; and
wherein an electrical contact is on a second major surface of the substrate opposite the first major surface of the substrate.

A monolithic integrated circuit is provided which comprises a lateral junction field effect transistor and a vertical junction field effect transistor;

the lateral junction field effect transistor comprising:
a buffer layer of a p-type semiconductor material formed in a portion of a first major surface of a drift layer;
a channel layer of an n-type semiconductor material on and non-coextensive with the buffer layer such that a portion of the buffer layer is exposed;
discrete source and drain regions each of an n-type semiconductor material in spaced relation on the channel layer;
a metal layer on the channel layer between the source and drain regions forming a metal-semiconductor rectifying junction with the channel layer;
ohmic contacts on the source region, the drain region and on the exposed portion of the buffer layer;

the vertical junction field effect transistor comprising:
one or more raised regions on the first major surface of the drift layer laterally spaced from the buffer layer each comprising a channel region of an n-type semiconductor material on the first major surface of the drift layer and spaced from the buffer layer of the lateral junction field effect transistor and a source region of an n-type semiconductor material on the channel region;
a metal layer on the drift layer adjacent to the one or more raised regions forming a metal-semiconductor rectifying junction with the drift layer and the channel region(s); and
an ohmic contact on the source region;

wherein the drift layer is on a first major surface of a substrate; and
wherein an electrical contact is on a second major surface of the substrate opposite the first major surface of the substrate.

BRIEF DESCRIPTION OF THE FIGURES

FIGS. 5A and 5B are a circuit representation (FIG. 5A) and an example layout (FIG. 5B) of a monolithic normally-off JFET integrated circuit comprising enhanced and depletion mode LTJFETs integrated with an SBD or a JBS diode.

FIG. 6 is a schematic cross-sectional representation of a hybrid normally-off JFET built using an enhanced mode LTJFET and a depletion mode VJFET having a built-in PiN diode.

FIG. 17 is a schematic cross-sectional representation of a hybrid guard-ring terminated normally-off JFET built using an enhanced mode dual-gate LJFET and a depletion mode VJFET with a Schottky gate wherein the bottom gate of the LJFET and the guard rings are implanted into the drift region.

FIGS. 18A-18D are a simulated device structure (FIG. 18A), schematic cross sectional representation (FIG. 18B) and graphs showing the output DC characteristics (FIGS. 18C and 18D) of a SiC LTJFET integrated switch.

REFERENCE NUMERALS

Figure 1:
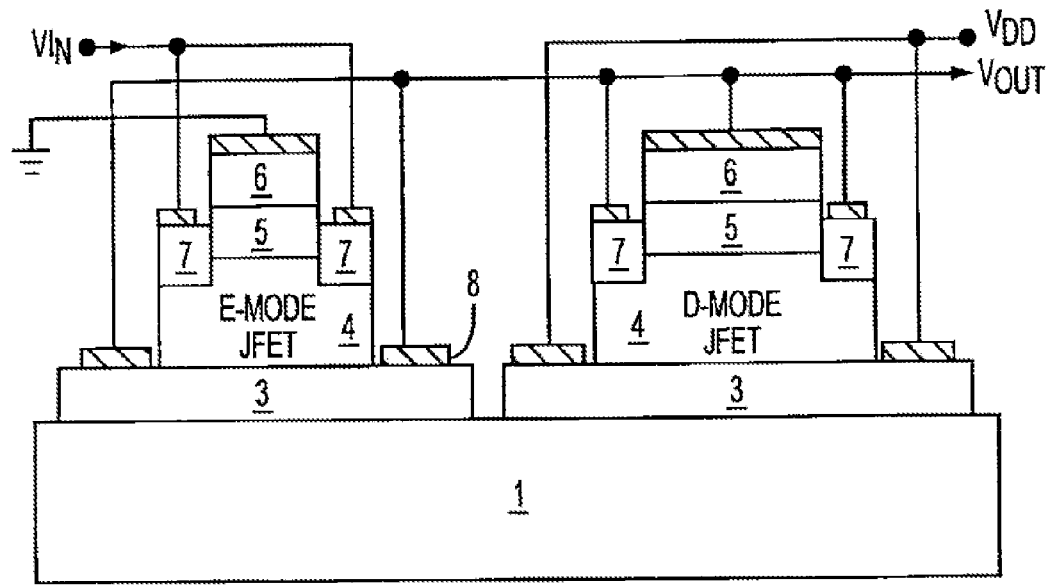
FIG. 1 is a schematic cross-section of a monolithic inverter circuit comprising enhanced and depletion mode LTJFETs.

The reference numerals used in the drawings are defined as set forth below. For the substrate, implanted regions, and epitaxially grown layers, representative thicknesses and doping concentrations are also provided.

| # | Material |
|---|---|
| 1 | Substrate (e.g., semi-insulating substrate) |
| 1a | N-type substrate (e.g., doping level >1 × $10^{18}$ cm$^{-3}$) |
| 2 | Epitaxially grown layer (p-type) (e.g., ≧0.1 μm thick, 1 × $10^{15}$-1 × $10^{17}$ cm$^{-3}$) |
| 3 | Epitaxially grown layer (n-type) (e.g., 0.2-5 μm, >5 × $10^{18}$ cm$^{-3}$) |
| 3a | Epitaxially grown layer (n-type) (e.g., 0.5-1 μm, >5 × $10^{18}$ cm$^{-3}$) |
| 4 | Epitaxially grown layer (n-type) (e.g., 0.5-10 μm 5 × $10^{15}$-5 × $10^{17}$ cm$^{-3}$) |
| 4a | Epitaxially grown layer (n-type) (e.g., 5-350 μm, 2 × $10^{14}$-2 × $10^{16}$ cm$^{-3}$) |
| 5 | Epitaxially grown layer (n-type) (e.g., 0.2-1.5 μm, 5 × $10^{15}$-5 × $10^{17}$ cm$^{-3}$ |
| 5a | Epitaxially grown layer (n-type) (e.g., 0.2-1.5 μm, 5 × $10^{15}$-2 × $10^{17}$ cm$^{-3}$) |
| 5b | Epitaxially grown layer (n-type) (e.g., 0.3-1.5 μm, 5 × $10^{15}$-2 × $10^{17}$ cm$^{-3}$) |
| 6 | Epitaxially grown layer (n-type) (e.g., 0.2-1.5 μm, >5 × $10^{18}$ cm$^{-3}$) |
| 6a | Implanted region (n-type) (e.g., ≧0.1 μm, ≧5 × $10^{18}$ cm$^{-3}$) |
| 7 | Implanted region (p-type) (e.g., ≧0.1 μm, ≧5 × $10^{18}$ cm$^{-3}$) |
| 7a | Epitaxially grown layer (p-type) (e.g., 0.2-1.5 μm, >5 × $10^{18}$ cm$^{-3}$) |
| 8 | Ohmic contact |
| 9 | Schottky contact |

DETAILED DESCRIPTION

The present invention will be described in more detail hereafter with reference to the accompanying drawings and photographs, in which preferred embodiments of the invention are described with silicon carbide (SiC) semiconductor serving as an example.

Silicon carbide crystallizes in numerous (i.e., more than 200) different modifications (polytypes). The most important are: 3C-SiC (cubic unit cell, zincblende); 2H-SiC; 4H-SiC; 6H-SiC (hexagonal unit cell, wurtzile); 15R-SiC (rhombohedral unit cell). The 4H polytype is more attractive for power devices, because of its higher electron mobility. Although the 4H-SiC is preferred, it is to be understood that the present invention is applicable to devices and integrated circuits described herein made of other wide bandgap semiconductor materials such as gallium nitride, and other polytypes of silicon carbide, by way of example.

FIG. 1 shows a schematic cross-section of enhanced and depletion mode semiconductor devices referred to a Lateral Trench Junction Field-Effect Transistors (LTJFETs), and a schematic presentation of electrical connections used to form a monolithic inverter circuit. As shown, the devices used to form the inverter are built on a wide bandgap semiconductor substrate (1), which can be either: semi-insulating; p-type; or n-type with a p-type buffer layer. As shown in FIG. 1, the devices comprise drain (3), drift (4), channel (5), and source (6) expitaxially grown n-type layers, and p-type implanted gate regions (7). The device structures can be defined using plasma etching and ion implantation. In the circuit shown in FIG. 1, the ohmic contacts to the source, gate, and drain regions can be formed on the same side of the wafer, which allows for the devices to be used in monolithic integrated circuits. A complete description of a device as described above and shown in FIG. 1 as well as an exemplary fabrication method for this device can be found in U.S. patent application Ser. No. 10/999,954, now U.S. Pat. No. 7,119,380, which is incorporated by reference herein in its entirety.

Figure 2:
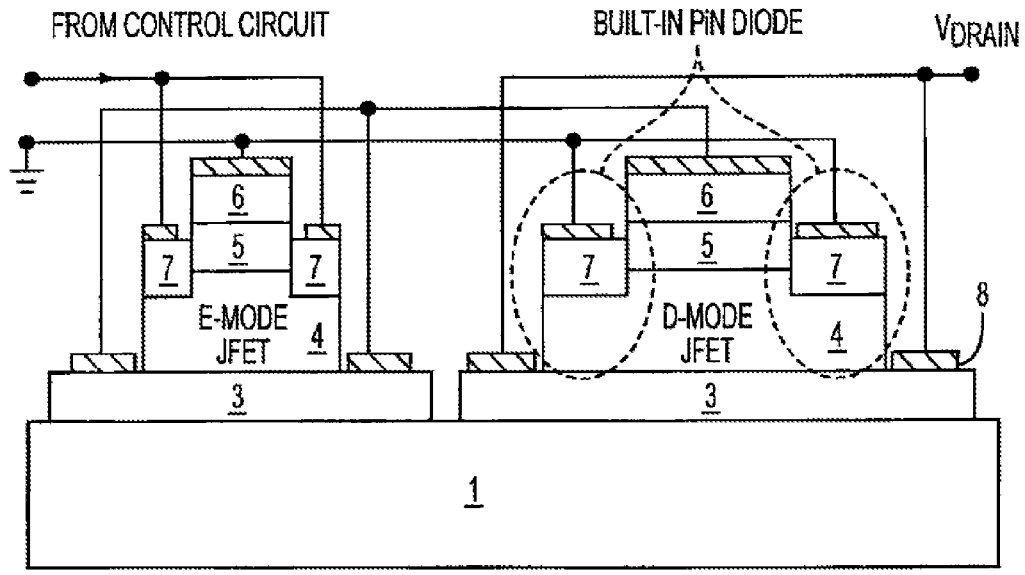
FIG. 2 is a schematic cross-section of a monolithic normally-off JFET comprising enhanced and depletion mode LTJFETs having a built-in PiN diode.

FIG. 2 is a schematic representation of a monolithic normally-off JFET comprising single-finger enhanced and depletion mode LTJFETs and having a built-in PiN diode. A schematic presentation of electrical connections is also shown in FIG. 2. As shown in FIG. 2, the devices are connected in cascode configuration in such a way that the drain of the enhanced mode transistor (referred to as an "EJFET") is connected to the source of the depletion mode transistor (referred to as a "DJFET"), and the gate of the DJFET is connected to the source of the control EJFET. The p-n junctions formed in between the gate regions (7) and the drift layer (4) of the DJFET of this device form a so called anti-parallel free-wheeling PiN diode. The size of this diode can be defined by the widths of implanted gate regions.

Figure 3A:
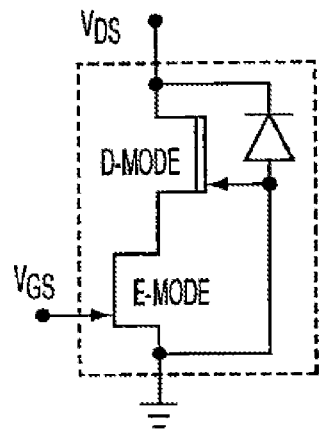
FIGS. 3A and 3B are a circuit representation (FIG. 3A) and an example layout (FIG. 3B) of a monolithic normally-off JFET integrated circuit comprising enhanced and depletion mode LTJFETs having a built-in PiN diode.
Figure 3B:
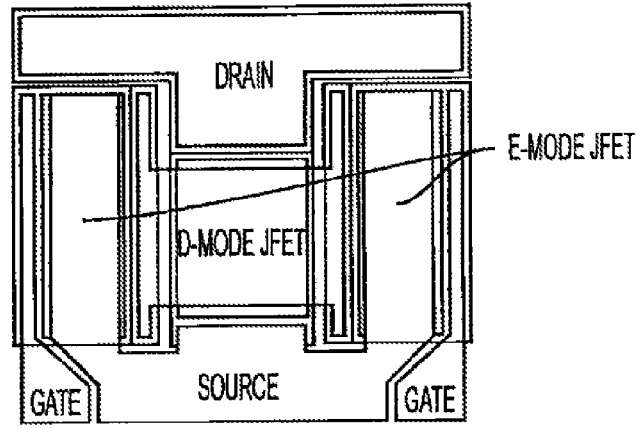

Although FIG. 2 shows single-finger device implementation of a normally-off JFET, in practice multi-finger LTJFETs can be used to form power switches. FIGS. 3A and 3B shows a schematic circuit representation (FIG. 3A) and an exemplary layout design (FIG. 3B) of a monolithic multi-finger normally-off power switch.

Figure 4:
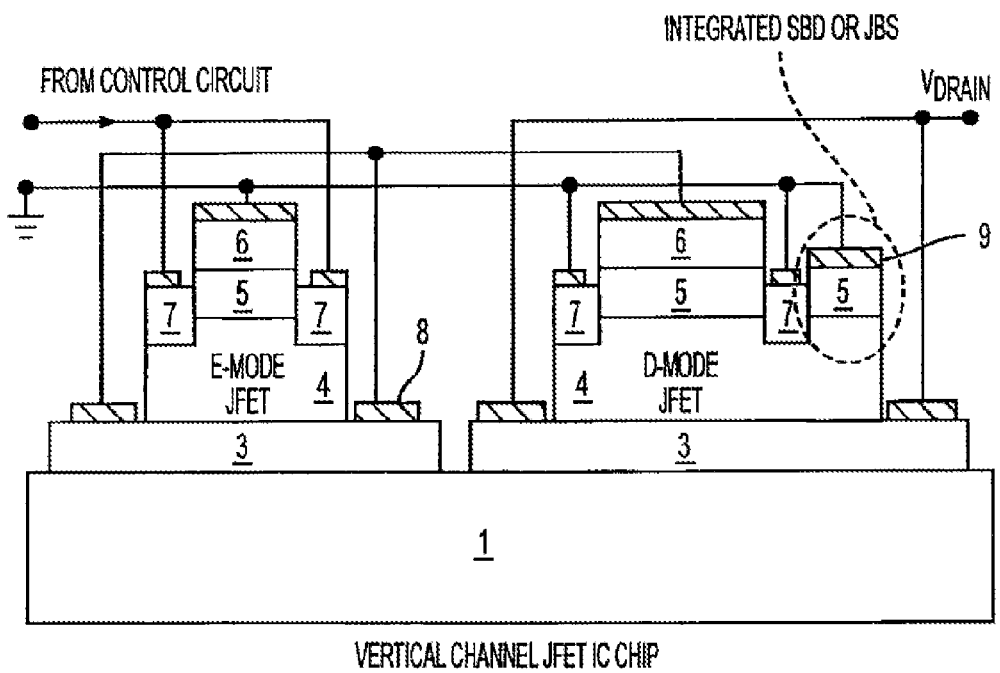
FIG. 4 is a schematic cross-sectional representation of a monolithic normally-off JFET built using enhanced and depletion mode LTJFETs integrated with an SBD or a JBS diode.

In order to reduce switching losses, the PiN diode shown as in FIGS. 3A and 3B can be replaced with a Schottky Barrier diode (SBD) or a Junction Barrier Schottky (JBS) diode. Methods of forming Schottky gates in a trench structure are disclosed in U.S. Patent Application No. 60/585,881, filed Jul. 8, 2004, which application is incorporated by reference herein in its entirety. FIG. 4 provides a schematic cross-section of a monolithic normally-off JFET power switch with an integrated free-wheeling SBD or JBS diode, and FIGS. 5A and 5B provide a schematic circuit representation (FIG. 5A) and exemplary layout design (FIG. 5B) of such a switch monolithically formed using multi-finger LTJFETs.

Figure 7:
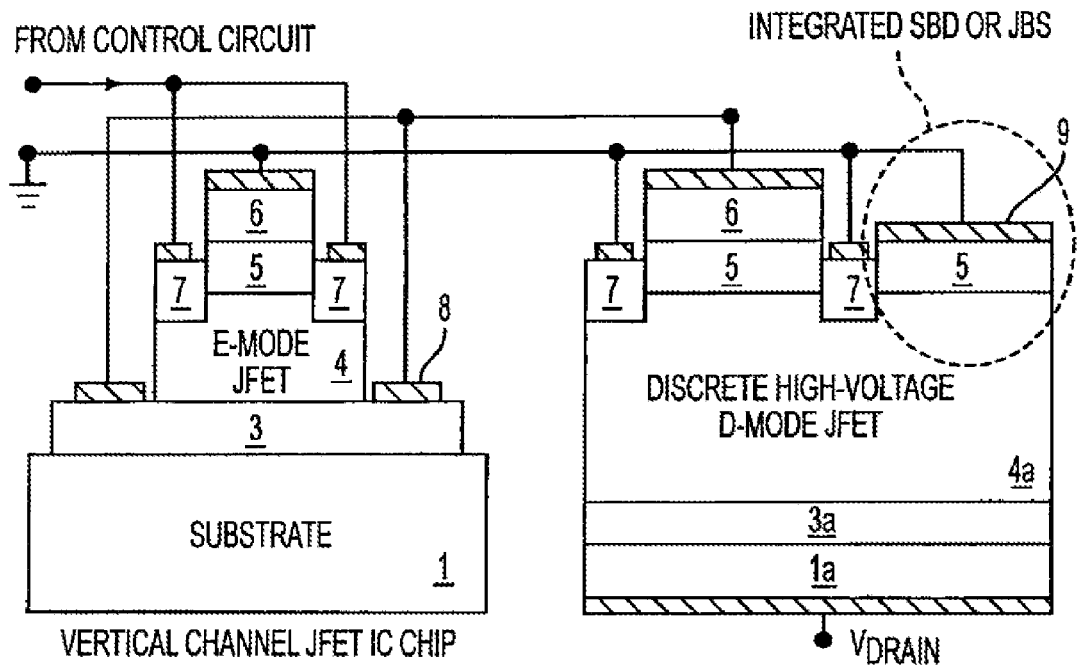
FIG. 7 is a schematic cross-sectional representation of a hybrid normally-off JFET built using enhanced mode LTJFETs and a depletion mode VJFET integrated with an SBD or a JBS diode.

FIGS. 6 and 7 are schematic cross-sectional representations of single-finger normally-off JFET power switches where enhancement-mode low-voltage LTJFETs control high-voltage discrete normally-on depletion-mode VJFETs.

FIG. 6 shows a hybrid JFET power switch with a built-in anti-parallel PiN diode, and FIG. 7 shows a JFET power switch comprising an anti-parallel SBD or JBS diode monolithically integrated with a high-voltage VJFET.

Figure 8:
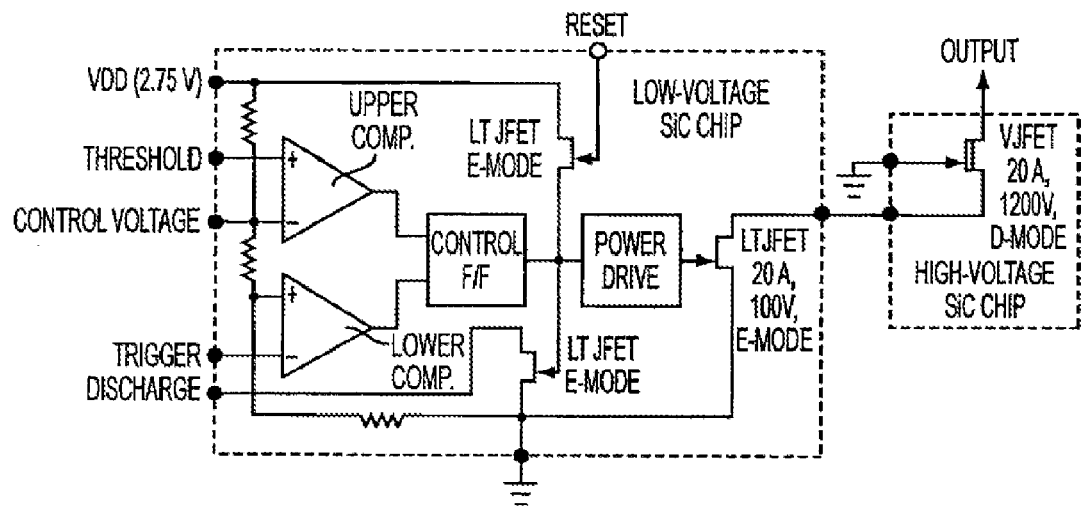
FIG. 8 is a circuit representation of a monolithic LTJFET timer circuit driving a built-on-chip low-voltage high-current enhanced-mode LTJFET connected in cascode with a discrete high-voltage normally-on power VJFET.

An exemplary implementation of the technology described above is shown in FIG. 8. As shown in FIG. 8, a monolithic LTJFET timer circuit drives a built-on-chip low-voltage high-current enhanced-mode LTJFET connected in cascode with a discrete high-voltage normally-on power VJFET.

Although vertical channel multi-finger LTJFETs are preferable in high-power application because of their low specific on-resistance and absence of trapping effects common in wide bandgap semiconductors, alternative JFET structures (e.g., those with a lateral channel) can also be employed to form normally-off power JFET switches. FIGS. 9-17 illustrate various exemplary embodiments of integrated JFET switches built using enhanced and depletion mode Lateral Junction Field-Effect Transistors (LJFETs).

Figure 9:
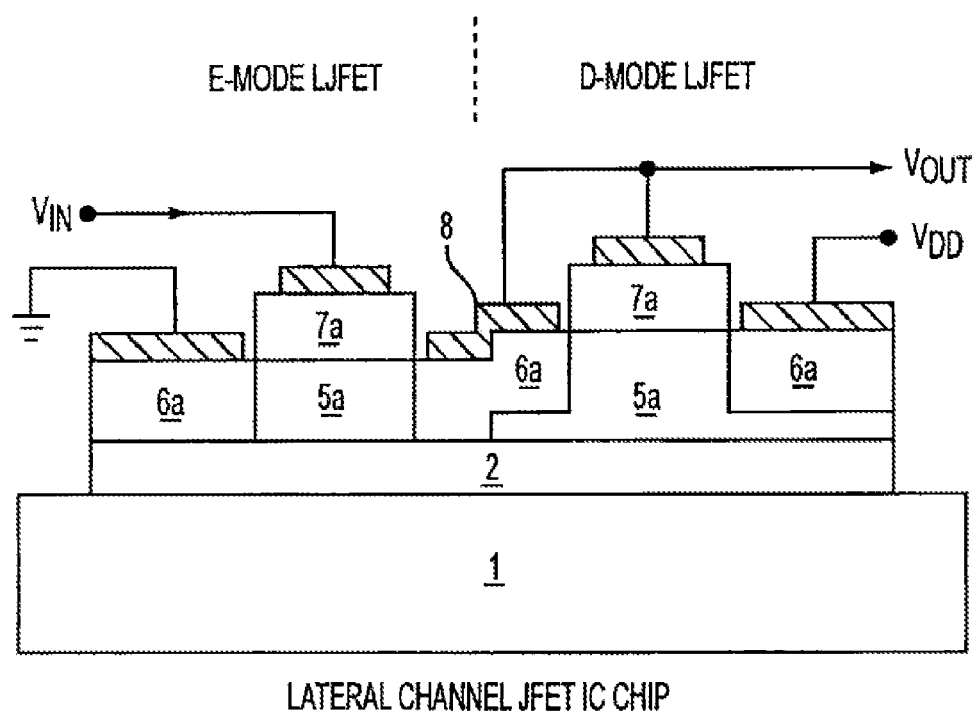
FIG. 9 is a schematic cross-sectional representation of a monolithic inverter circuit built using enhanced and depletion mode overgrown-gate LJFETs.

FIG. 9 is a schematic cross-sectional representation with electrical connections of a lateral channel JFET integrated circuit comprising enhanced and depletion mode LJFETs having expitaxially overgrown gates. As shown in FIG. 9, the integrated circuit forms a monolithic inverter circuit. The LJFETs used to form the inverter are built on the wide bandgap semiconductor substrate (1), which can be either: semi-insulating; p-type; or n-type with a p-type buffer layer. As shown in FIG. 9, the integrated circuit comprises buffer (2) and channel (5a) epitaxially grown n-type layers, as well as implanted source and drain (6a) regions and expitaxially grown p-type gate regions (7a). The device structures can be defined using plasma etch and ion implantation. The ohmic contacts (8) to the source, gate, and drain regions can be formed on the same side of the wafer allowing for the use of the device in monolithic integrated circuits.

Figure 10:
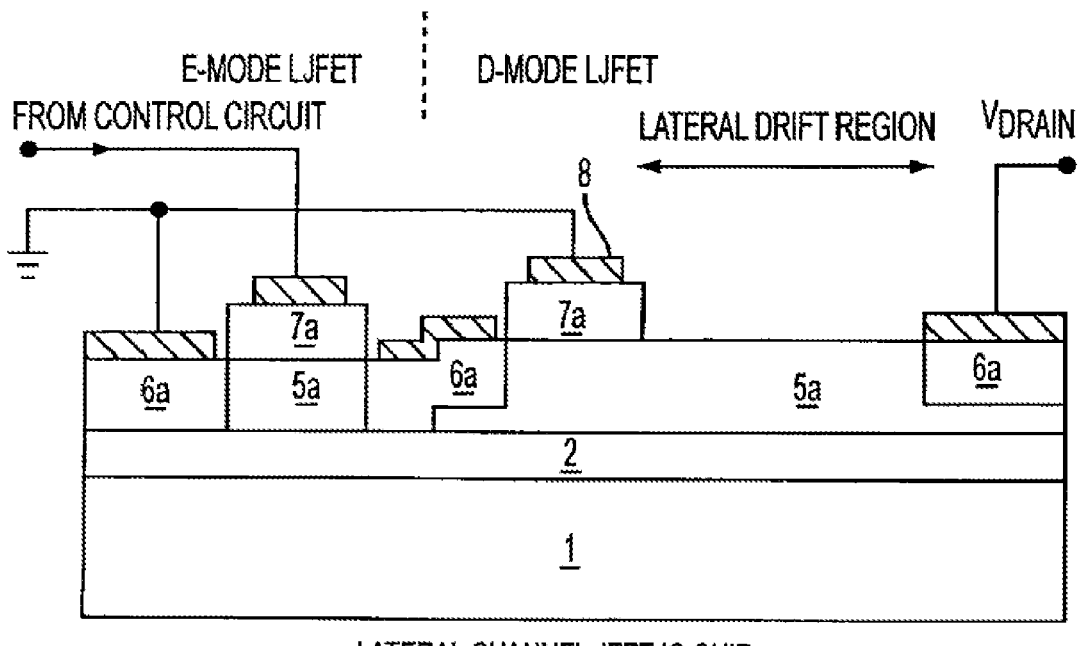
FIG. 10 is a schematic cross-sectional representation of a hybrid normally-off JFET comprising an enhanced mode overgrown-gate LJFET and a depletion mode VJFET.

FIG. 10 is a schematic representation of a pitch of a monolithic normally-off JFET power switch built using enhanced and depletion mode LJFETs with overgrown gate regions. As can be seen from the schematic presentation of electrical connections, the devices are connected in cascode configuration in such a way that the drain of the low-voltage enhanced mode LJFET (referred to as an "ELJFET") is connected to the source of the higher-voltage depletion mode LJFET (referred to as a "DLJFET"), and the gate of the DLJFET is connected to the source of the control ELJFET.

Figure 11:
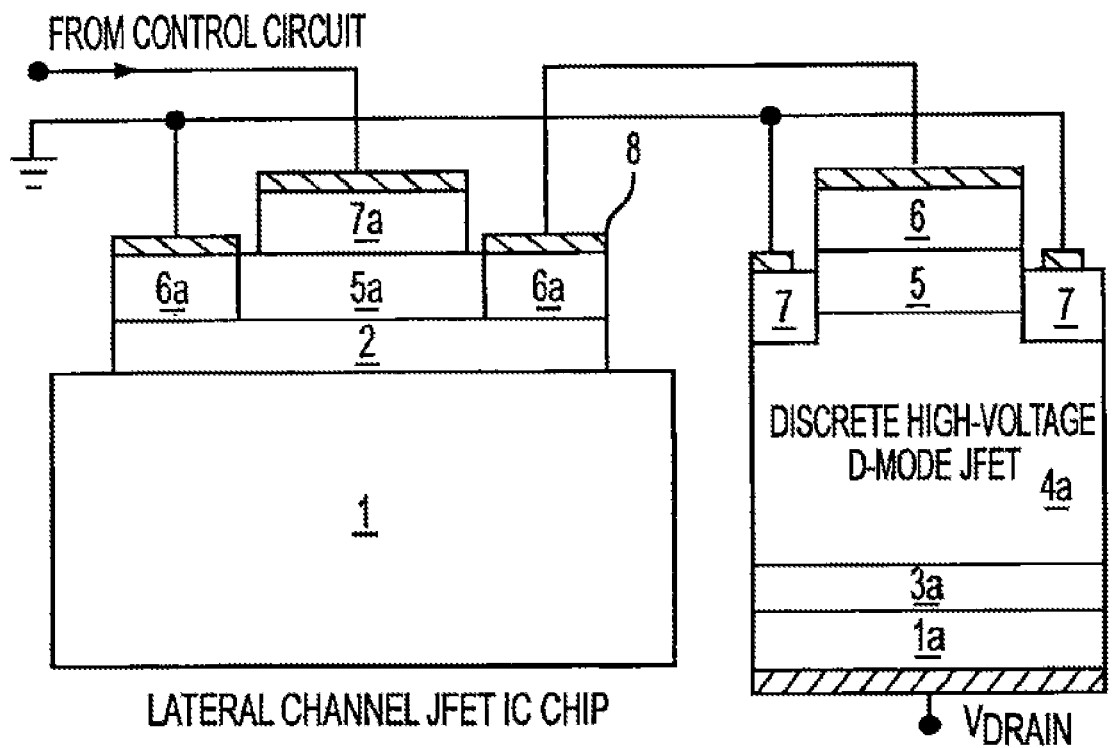
FIG. 11 is a schematic cross-sectional representation of a hybrid normally-off JFET power-switch comprising a low voltage enhanced mode LJFET and a high voltage discrete normally-on depletion mode VJFET.

FIG. 11 shows a schematic cross-section of a hybrid normally-off JFET power switch wherein a low-voltage ELJFET controls a high-voltage discrete normally-on depletion-mode VJFET.

An alternative LJFET structure where source and drain regions are formed in an epitaxially grown n-type layer and gate regions are defined by ion implantation can also be used. Devices of this type are shown in FIGS. 12-17.

Figure 12:
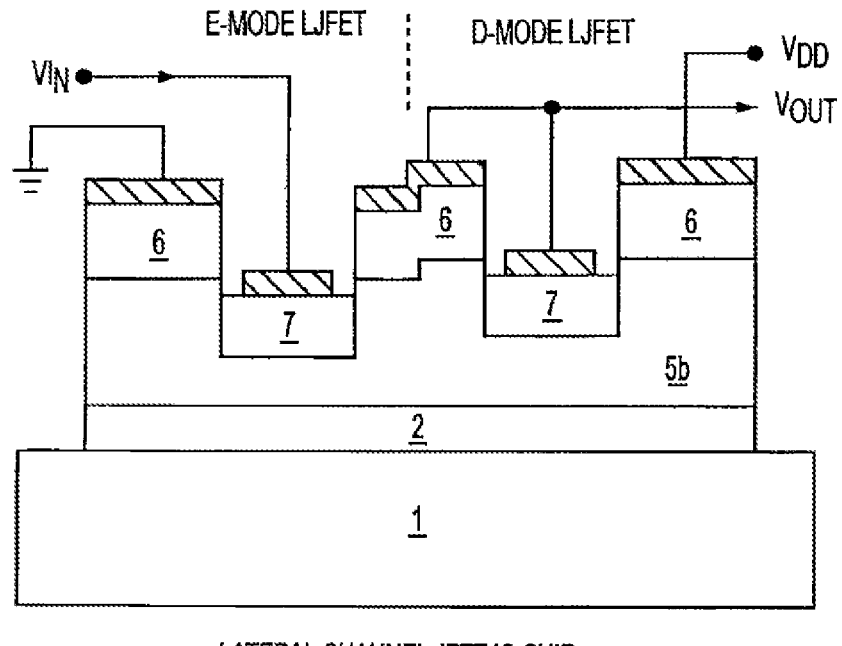
FIG. 12 is a schematic cross-sectional representation of a monolithic inverter circuit built using enhanced and depletion mode implanted-gate LJFETs.

FIG. 12 shows is a schematic cross-sectional representation with electrical connections of a monolithic inverter circuit comprising enhanced and depletion mode implanted-gate LJFETs. As shown, the devices used to form the inverter are built on a wide bandgap semiconductor substrate (1), which can be either: semi-insulating; p-type; or n-type with a p-type buffer layer. As also shown, the device comprises buffer (2), channel (5b), source and drain (6) epitaxially grown n-type layers, as well as implanted gate (7) regions.

Figure 13:
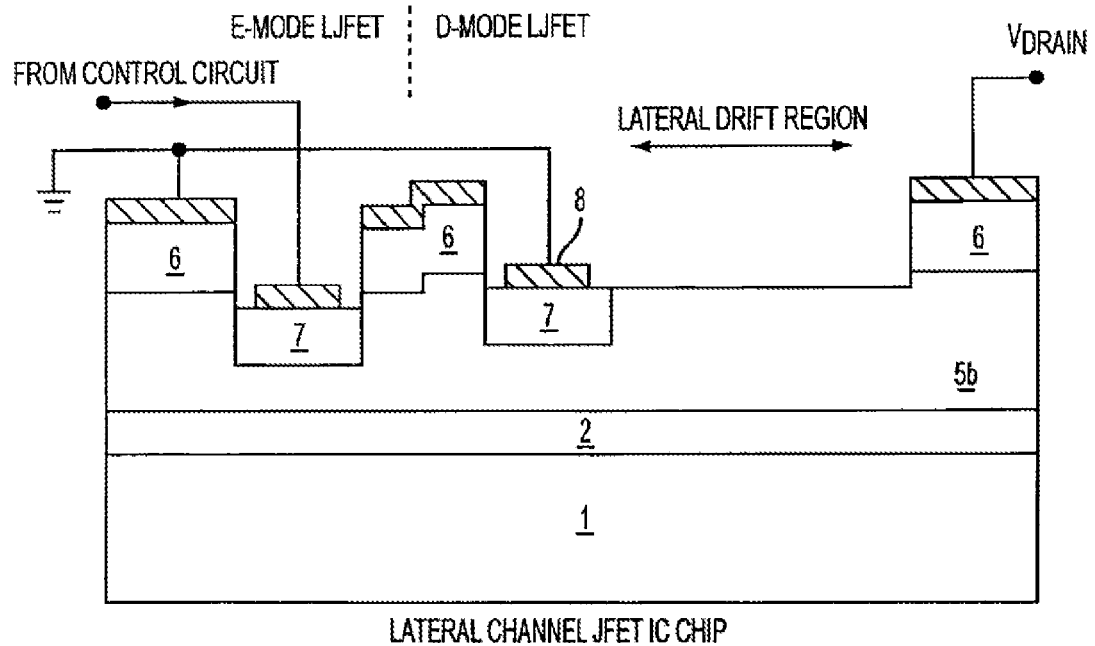
FIG. 13 is a schematic cross-sectional representation of a monolithic normally-off JFET integrated circuit built using enhanced and depletion mode implanted-gate LJFETs.

FIG. 13 is a schematic cross-sectional representation of a pitch of a monolithic normally-off JFET power switch built using enhanced and depletion mode implanted-gate LJFETs. As shown in FIG. 13, the drain of the D-mode LJFET is laterally spaced from the gate on the channel layer (5b) to form a lateral drift region in the device.

Figure 14:
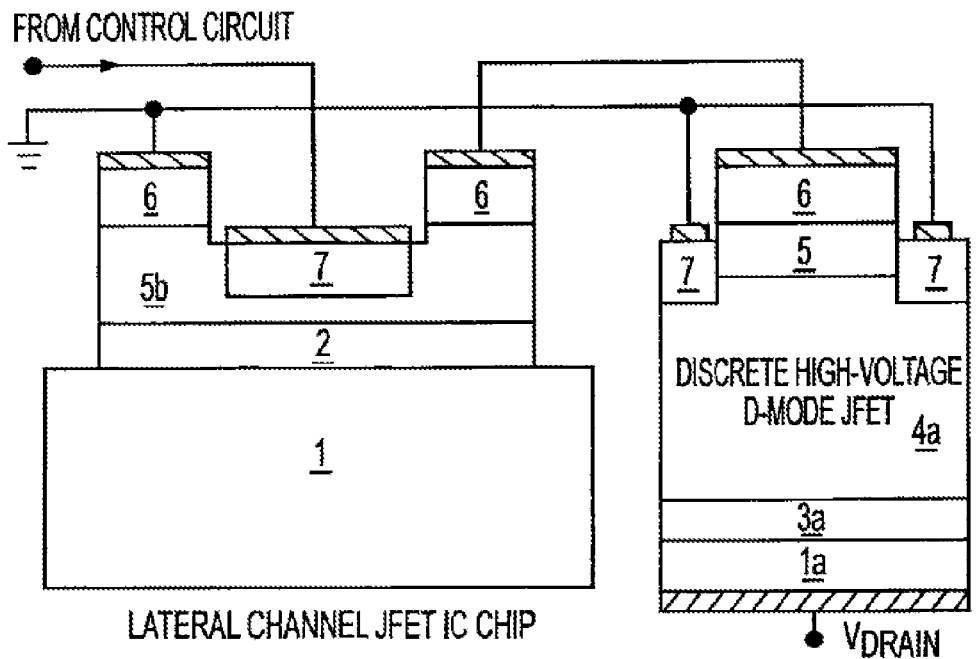
FIG. 14 is a schematic cross-sectional representation of hybrid normally-off JFET integrated circuit built using an enhanced mode implanted-gate LJFET and a depletion mode VJFET.

FIG. 14 is a schematic cross-sectional representation of a normally-off JFET power switch where an enhancement-mode low-voltage implanted-gate LJFET controls a high-voltage discrete normally-on depletion-mode VJFET.

Figure 15:
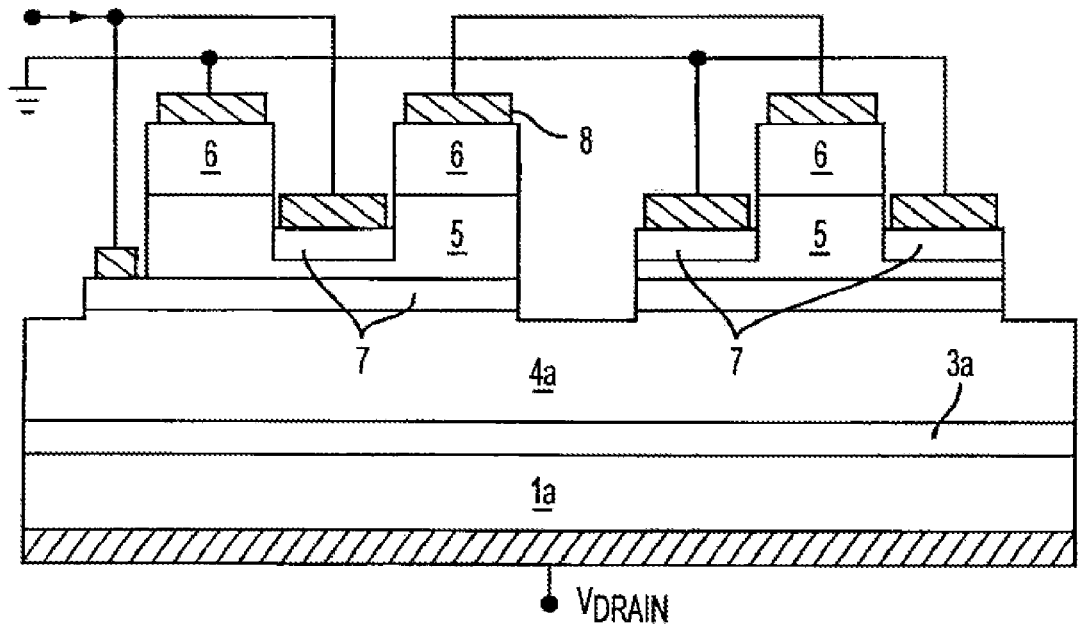
FIG. 15 is a schematic cross-sectional representation of a hybrid normally-off JFET integrated circuit built using an enhanced mode dual-gate LJFET and a depletion mode VJFET wherein the bottom gate of the LJFET is implanted into the drift region.

FIG. 15 is a schematic cross-sectional representation of a monolithic normally-off JFET power switch wherein an enhancement-mode low-voltage dual-gate LJFET controls a high-voltage discrete normally-on depletion-mode VJFET. As shown in FIG. 15, the bottom gate of the LJFET is implanted into drift region (4) before the channel region is grown thereon.

Figure 16:
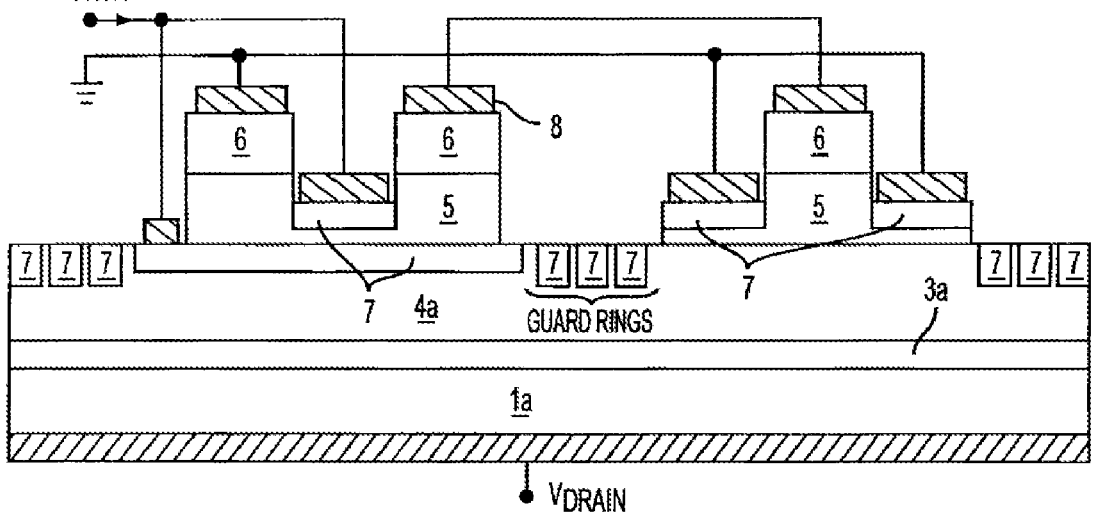
FIG. 16 is a schematic cross-sectional representation of a hybrid guard-ring terminated normally-off JFET integrated circuit built using an enhanced mode dual-gate LJFET and a depletion mode VJFET wherein the bottom gate of the LJFET and the guard rings are implanted into the drift region.
Figure 18C:
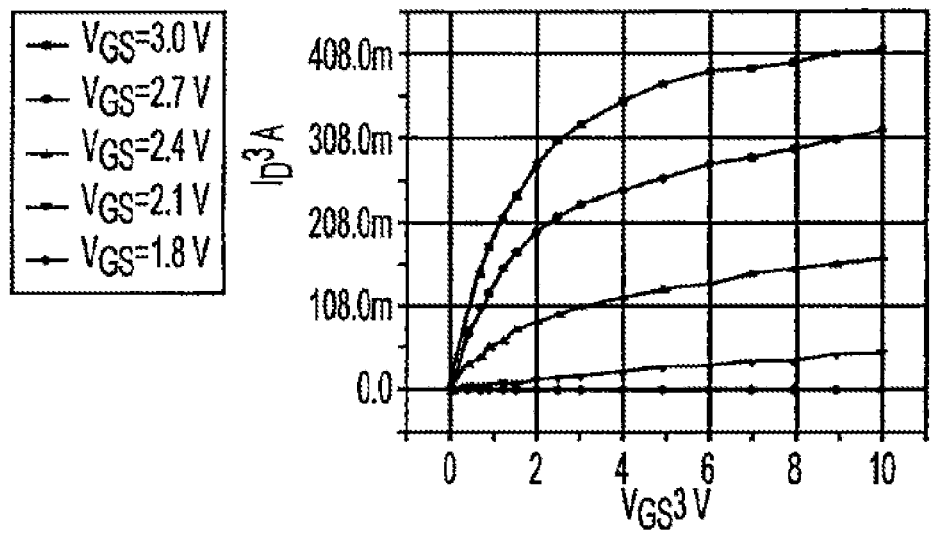
Figure 18D:
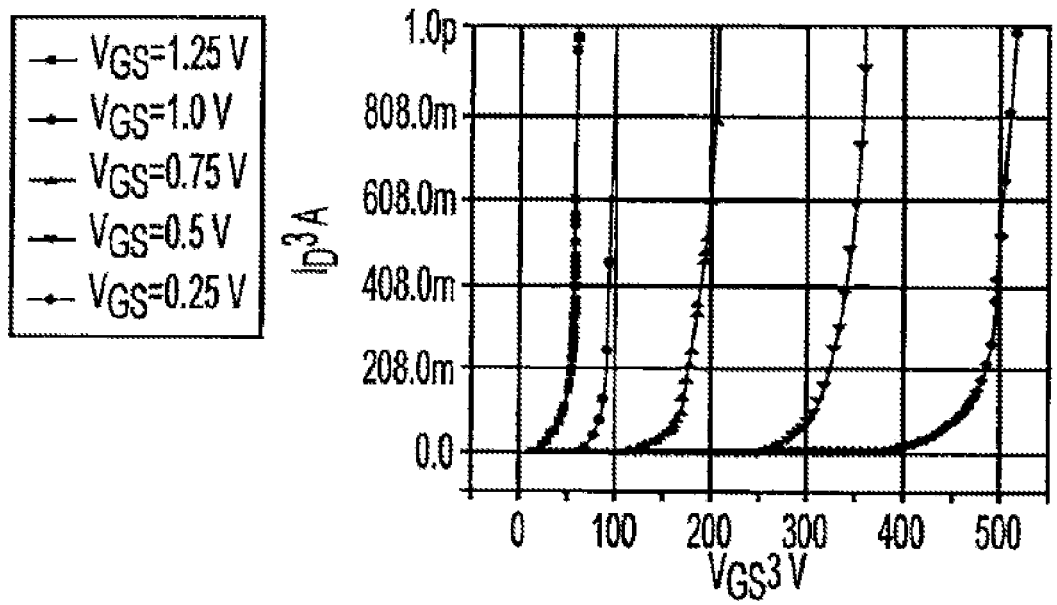
Figure 19A:
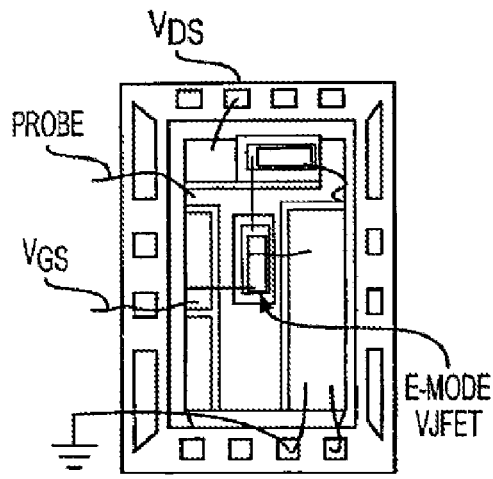
FIGS. 19A-19D are a photograph (FIG. 19A), circuit representation (FIG. 19B) and graphs (FIGS. 19C and 19D) showing measured characteristics of a hybrid normally-off 900 V power switch.
Figure 19B:
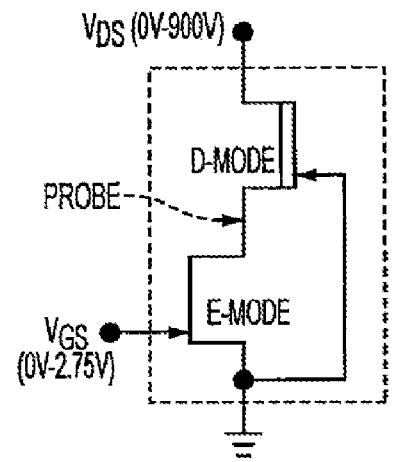
Figure 19C:
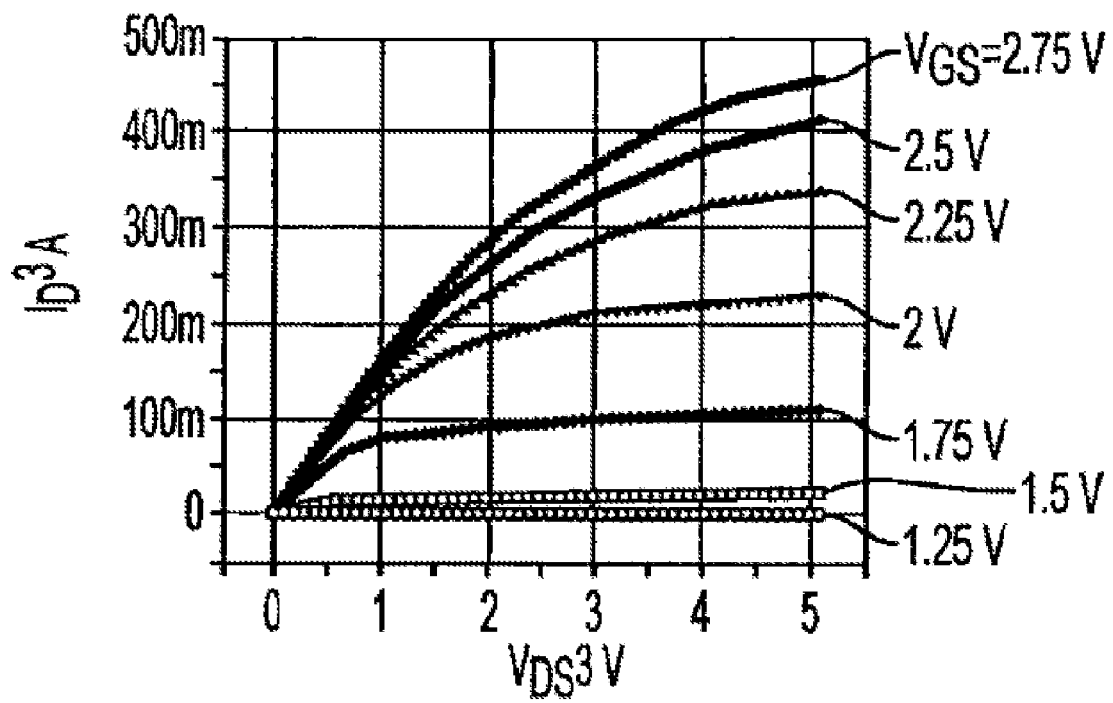
Figure 19D:
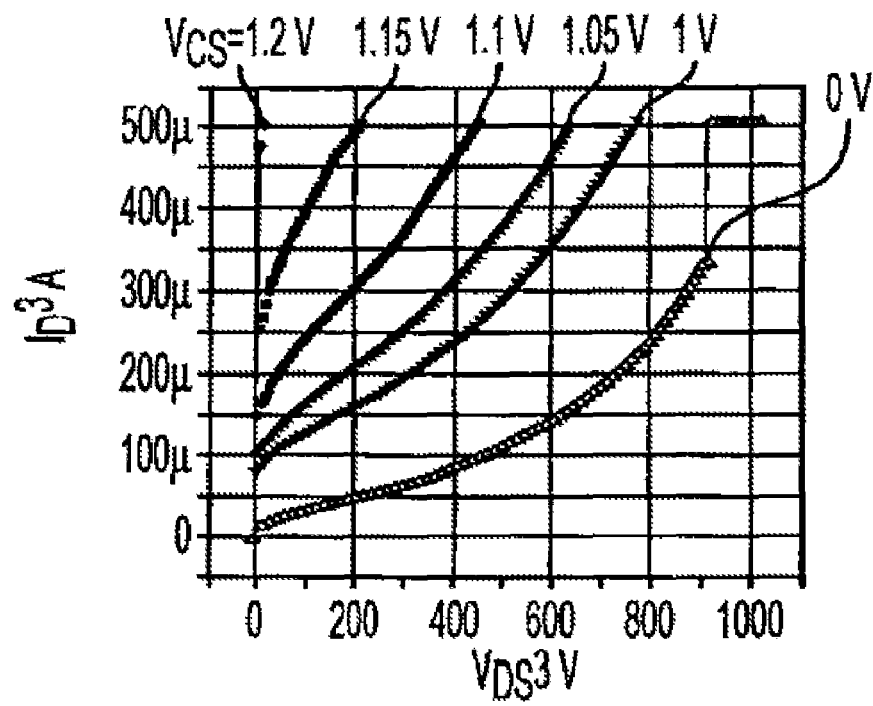

FIG. 16 is a schematic cross-sectional representation of a device as shown in FIG. 3D wherein the bottom gate of the LJFET is implanted into drift region 4 together with guard rings. The guard rings can be used to increase the voltage blocking capability of the switch.

The epitaxially grown n-type layer (3a) shown in the devices in FIGS. 6, 7, 11, 14, 15, 16 and 17 is optional. This layer can be grown on the substrate to improve the quality of the epitaxially grown n-type layer (4a). The devices shown in FIGS. 6, 7, 11, 14, 15, 16 and 17 may or may not include this layer.

Although FET devices having implanted p-type gates are described above, Schottky gates can also be employed for the fabrication of a normally-off FET power switch. FIG. 17 is a schematic cross-sectional representation of a device as shown in FIG. 16 wherein the implanted p-type top gate of the LJFET and the implanted gate of the discrete normally-on depletion-mode VJFET are replaced with Schottky gates. As shown, the Schottky gate of the discrete normally-on FET also serves as an integrated anti-parallel free-wheeling diode.

FIGS. 18A-18D shows a simulated device structure (FIG. 18A), schematic cross-sectional representation (FIG. 18B) and graphs showing the output DC characteristics (FIGS. 18C and 18D) of a SiC LTJFET integrated switch, where both the EJFET and the DJFET have channel peripheries of 1 cm.

In order to demonstrate feasibility of the above described cascode power switch, a hybrid embodiment of the switch was constructed using discrete non-terminated enhanced and depletion mode vetical JFETs. FIGS. 19A-19D are a photograph (FIG. 19A), a schematic representation (FIG. 19B) and graphs showing measured characteristics (FIGS. 19C and 19D) of a hybrid normally-off, 900 V power switch. As can be seen from FIGS. 19C and 19D, despite relatively high leakage current ($I_D$=330 µA @ $V_{DS}$=900 V and $V_{GS}$=0 V) induced by the depletion mode device, the voltage-controlled SiC power switch was controlled by as little as 2.75 V.

Figure 20A:
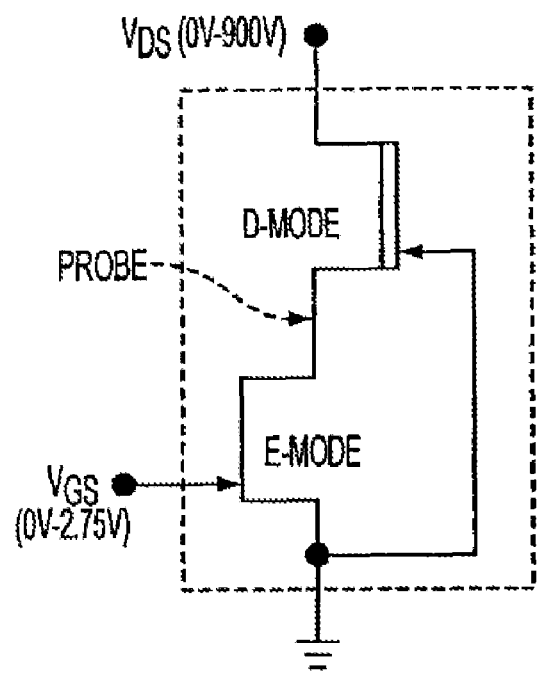
FIGS. 20A and 20B are a circuit representation (FIG. 20A) and a graph (FIG. 20B) showing measured internal voltages of a hybrid normally-off, 900 V power switch.
Figure 20B:
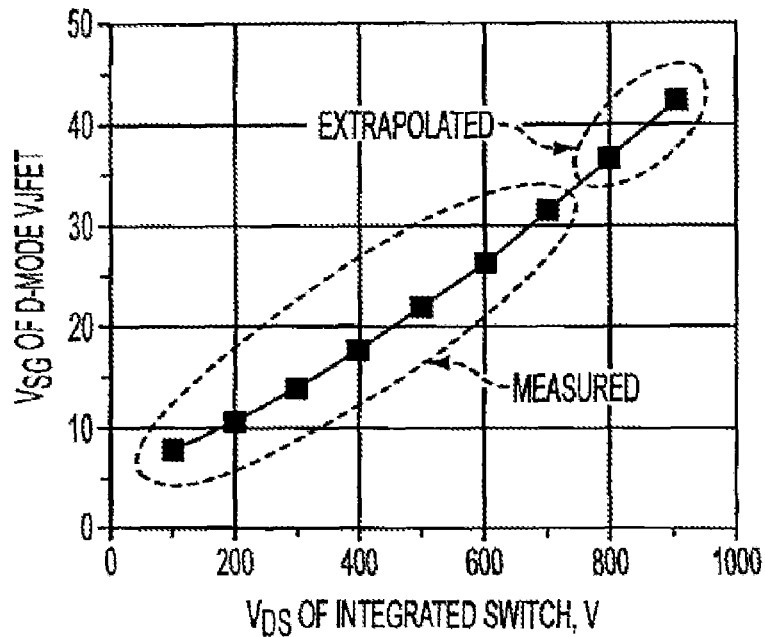

The basic function of the switch can be described as follows. At the HIGH control level (e.g., $V_{GS}$=2.75 V), the enhanced mode transistor (EJFET) is turned on. Between the gate and source of the depletion mode transistor (DJFET) only a small voltage drop occurs, therefore, DJFET is on too. If EJFET is turned off with the LOW control level (VGS=0.25 V) its drain-to-source voltage increases to 40-50V as shown in FIG. 20B. This voltage pinches-off the DJFET.

The specific on-resistance of the integrated switch can be minimized as follows. First, the ratios of pinch-off voltages and channel peripheries of both transistors (e.g., EJFET and DJFET) can be adjusted so that they will have approximately equal on-resistances and neither one will therefore limit the overall current. Second, the device can be constructed such that the gate-to-source breakdown voltage of DJFET is equal or higher than the drain-to-source breakdown voltage of EJFET.

Figure 21A:
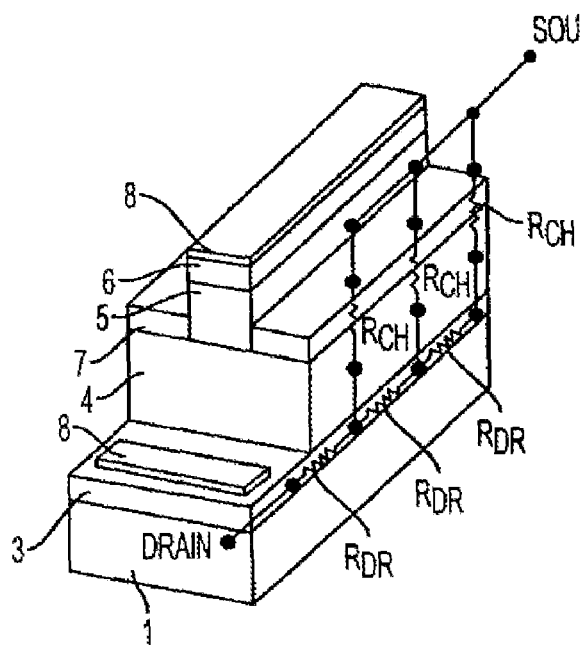
FIGS. 21A-21C are schematic representations of distributed drain resistances of an LTJFET (FIG. 21A) and a VJFET (FIG. 21B) along with a graph (FIG. 21C) showing the resistance of the lateral drain layer of an LTJFET normalized to the resistance of the vertical drain of a VJFET as a function of finger length for different doping levels of the lateral drain layer.
Figure 21B:
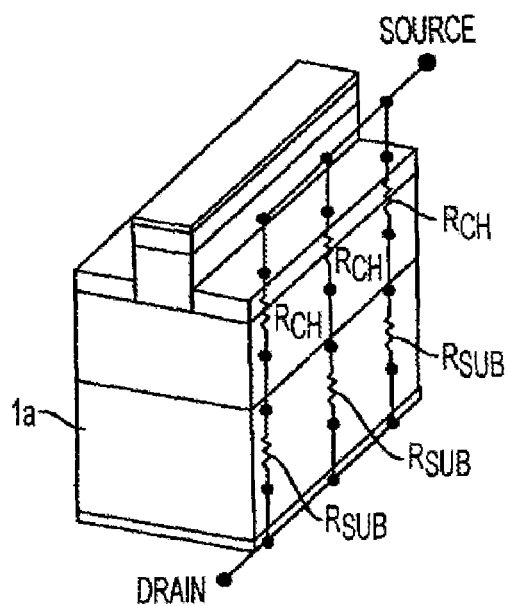
Figure 21C:
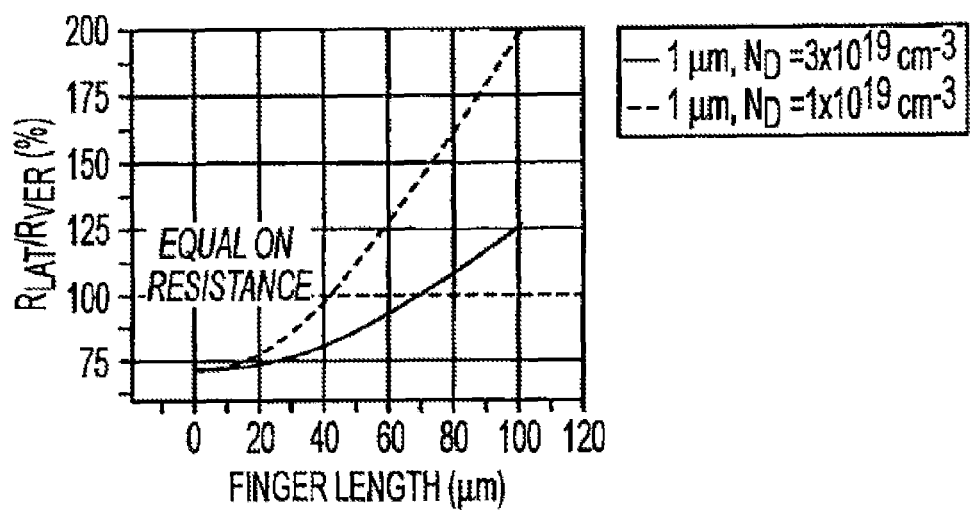

In addition, the finger length of high-current multi-finger LTJFETs can be reduced to keep the resistances of the alteral drain region compatible to the resistance of the vertical n+ substrate. FIGS. 21A and 21B are schematic representations of distributed drain resistances of LTJFET (FIG. 21A) and VJFET (FIG. 21B), and graph (FIG. 21C) showing resistance of the lateral drain layer of LTJFET normalized to the resistance of the vertical drain of VJFET as a function of finger length for different dopings of the lateral drain layer. As can be seen from FIG. 21C, for a heavily doped 1-μm thick lateral drain layer (3), the finger length of the LTJFET will preferably not exceed 100 μm in length. The finger length, however, can be increased by increasing the thickness and/or the doping levels of the drain layer (3).

Figure 22A:
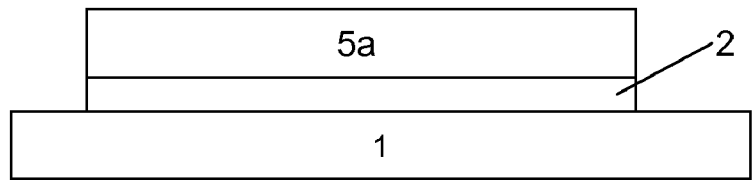
FIGS. 22A-22H illustrate a method of making a monolithic integrated circuit as set forth in FIGS. 9 and 10.
Figure 22B:
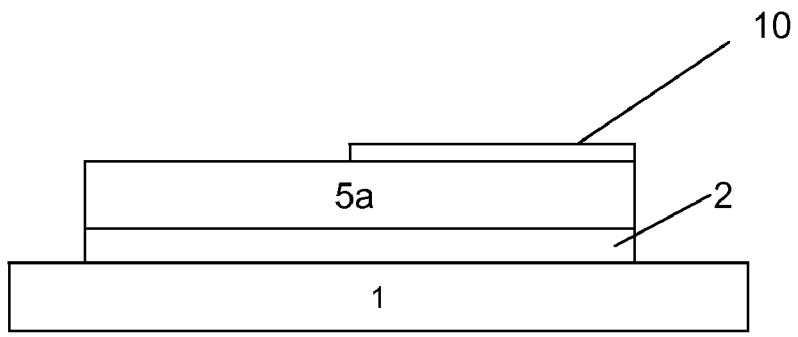
Figure 22C:
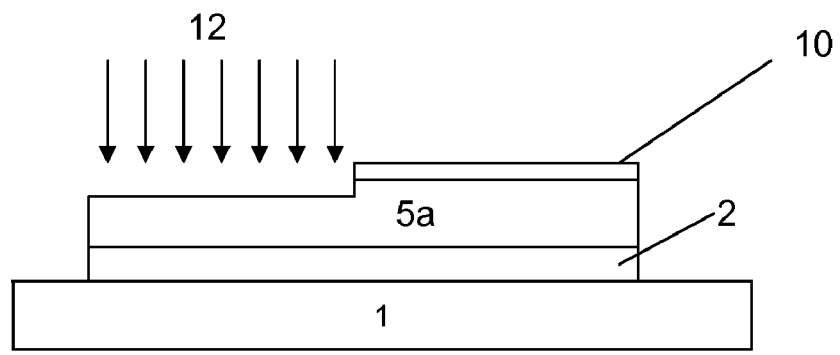
Figure 22D:
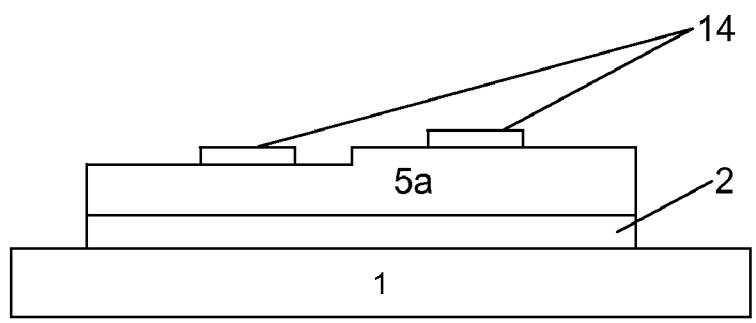
Figure 22E:
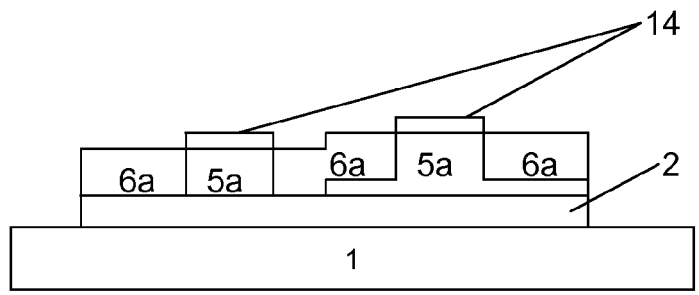
Figure 22F:
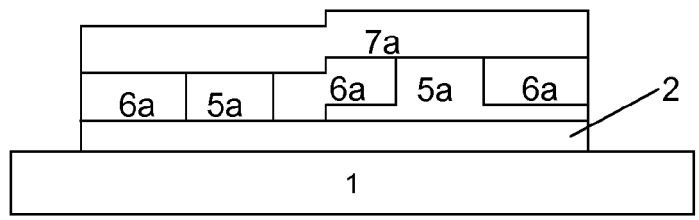
Figure 22G:
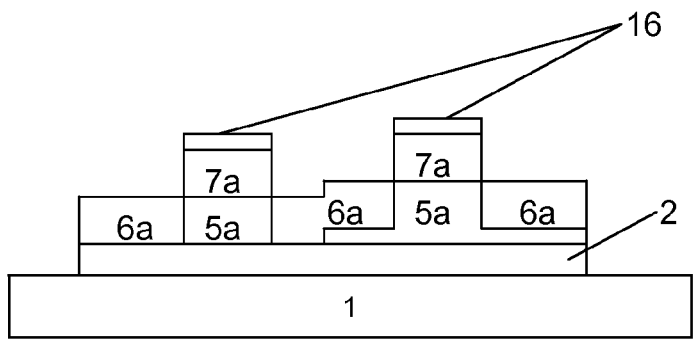
Figure 22H:
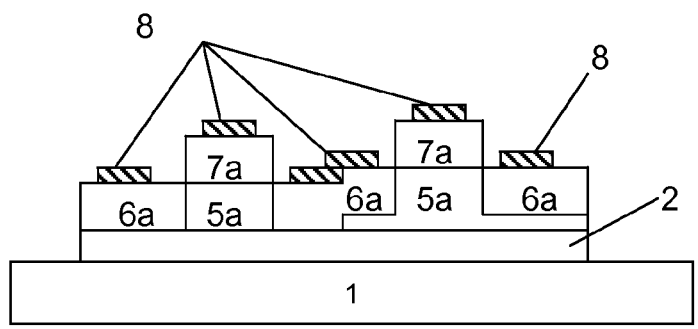

FIGS. 22A-22H illustrate a method of making a device as set forth in FIG. 9. FIG. 22A shows a multi-layer structure comprising a substrate (1), an epitaxially grown p-type layer (2), and an epitaxially grown n-type layer (5a). An etch mask (10) is positioned on the exposed surface of epitaxially grown n-type layer (5a) as shown in FIG. 22B. Epitaxially grown n-type layer (5a) is then selectively etched (12) as shown in FIG. 22B. Etch mask (10) is then removed and ion implantation mask (14) is then placed on the etched surface of epitaxially grown n-type layer (5a) as shown in FIG. 22D. Ion implantation of n-type dopants through mask (14) results in the formation of highly n-doped regions (6a) in epitaxially grown n-type layer (5a) as shown in FIG. 22E. Mask (14) is then removed and a layer of p-type semiconductor material (7a) is grown on the etched and implanted surface of epitaxially grown n-type layer (5a) as shown in FIG. 22F. Etch mask (16) is then positioned on the exposed surface of layer (7a) as shown in FIG. 22G. Etching through mask (16) results in selective removal of layer (7a) and formation of raised p-type features as also shown in FIG. 22G. Finally, mask (16) is removed and ohmic contacts are formed on exposed surfaces of the raised p-type features and the implanted regions (6a).

The method as outlined above can also be used, by selecting appropriate masks, to form a structure as shown in FIG. 10.

Figure 23A:
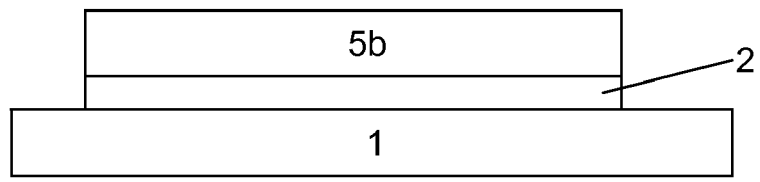
FIGS. 23A-23H illustrate a method of making a monolithic integrated circuit as set forth in FIGS. 12 and 13.
Figure 23B:
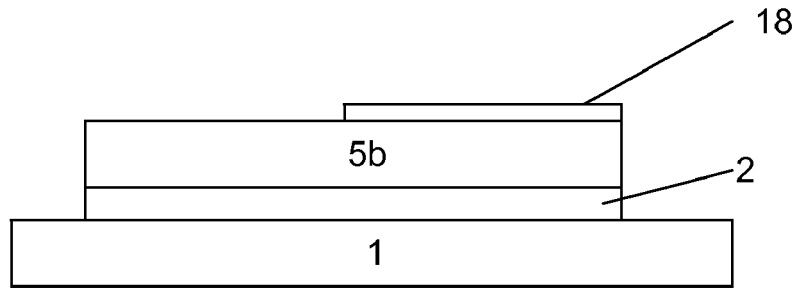
Figure 23C:
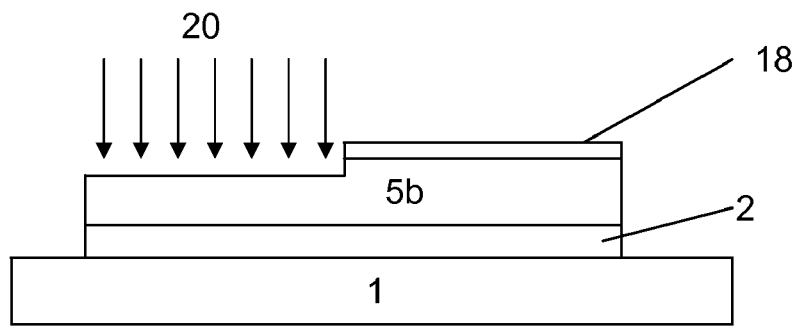
Figure 23D:
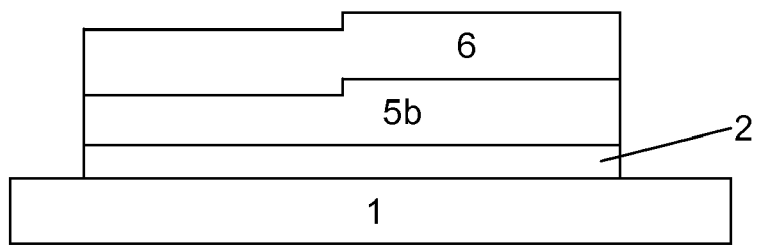
Figure 23E:
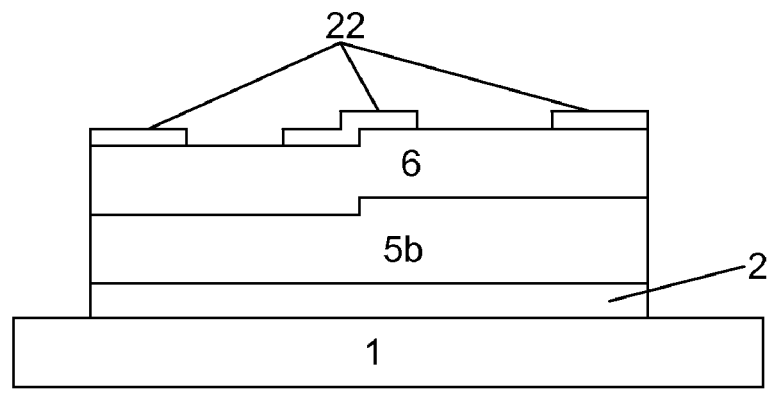
Figure 23F:
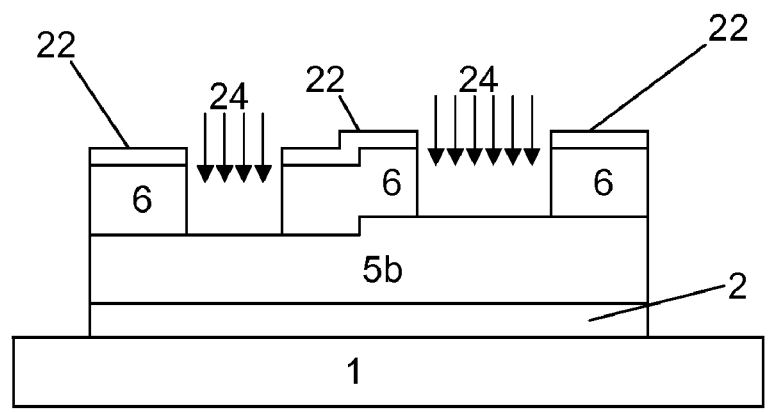
Figure 23G:
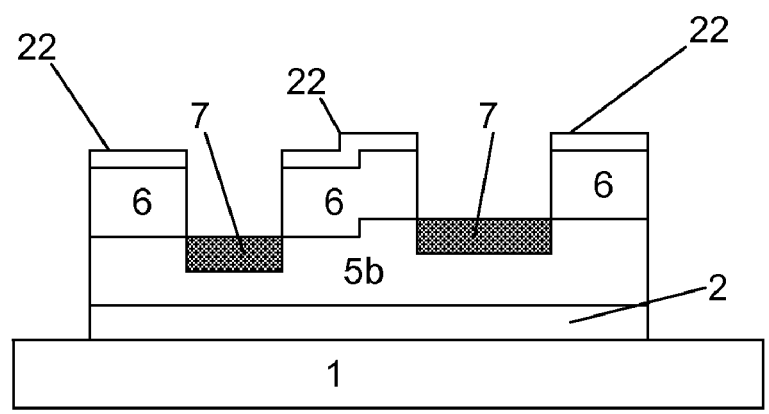
Figure 23H:
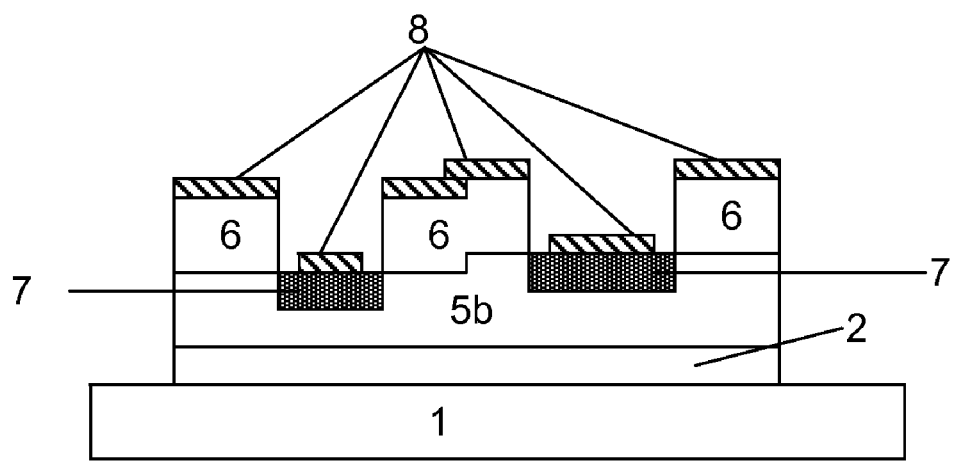

FIGS. 23A-23H illustrate a method of making a structure as shown in FIG. 12. FIG. 23A shows a substrate (1), an epitaxially grown p-type layer (2) on the substrate (1), and an epitaxially grown n-type layer (5b) on layer (2). As shown in FIG. 23B, an etch mask (18) is positioned on the exposed surface of layer (5b). Etching (20) results in selective removal of material from layer (5b) as shown in FIG. 23C. After removal of mask (18), an n-type epitaxial layer (6) is grown on the etched surface of layer (5b) as shown in FIG. 23D. Etch mask (22) is positioned on the exposed surface of layer (6) as shown in FIG. 23E and etching (24) results in selective removal of material from layer (6) and exposure of underlying layer (5b) as shown in FIG. 23F. Mask (22) is then used to selectively implant p-type donors in exposed surface of layer (5b) to form implanted gate regions (7) as shown in FIG. 23G. Ohmic contacts (8) are then formed on the implanted p-type gate regions (7) to form the gate contacts and on the raised n-type regions (6) to form the source and drain contacts for the device as shown in FIG. 23H.

The method as outlined above can also be used, by selecting appropriate masks, to form a structure as shown in FIG. 13.

Figure 24A:
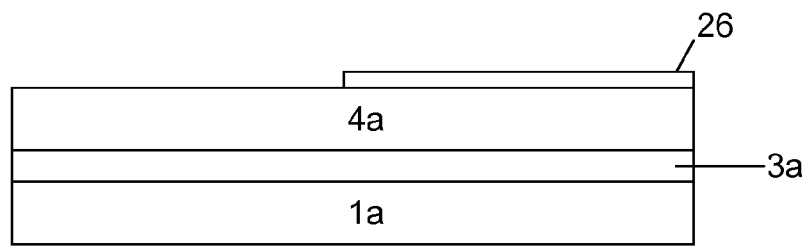
FIGS. 24A-24J illustrate a method of making a monolithic integrated circuit as set forth in FIG. 15.
Figure 24B:
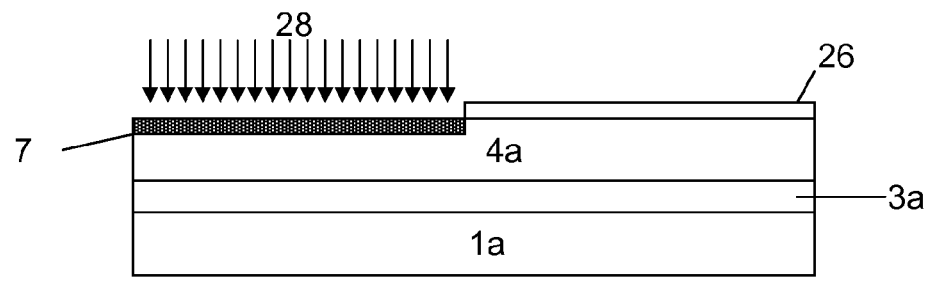
Figure 24C:
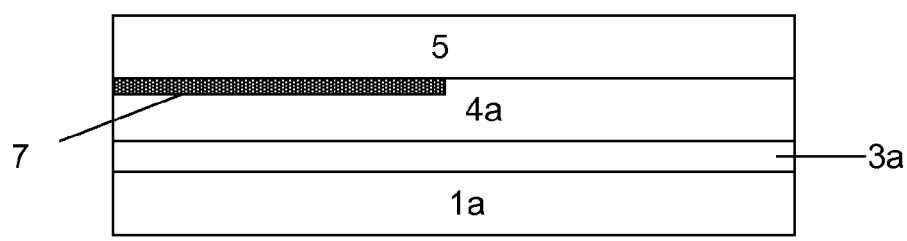
Figure 24D:
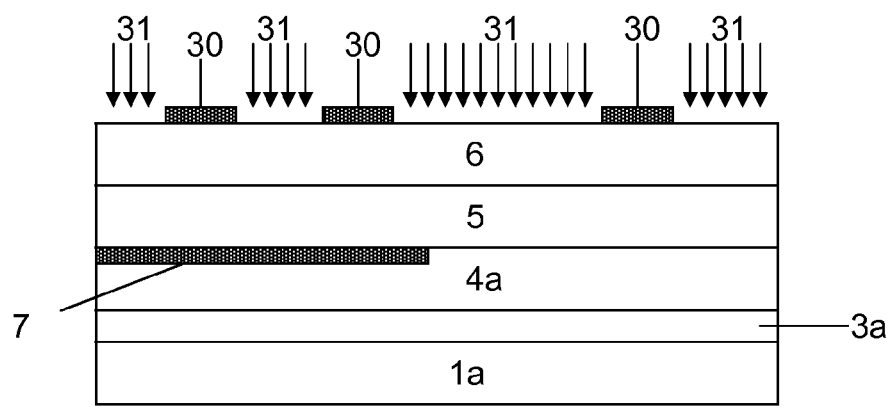
Figure 24E:
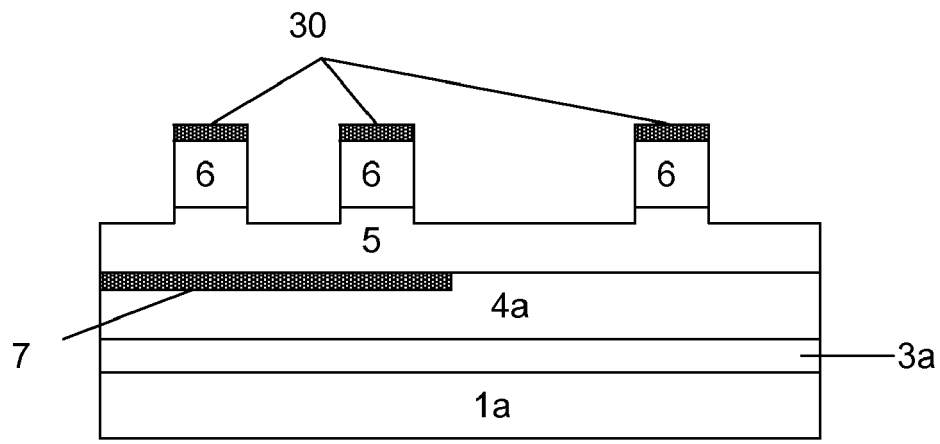
Figure 24F:
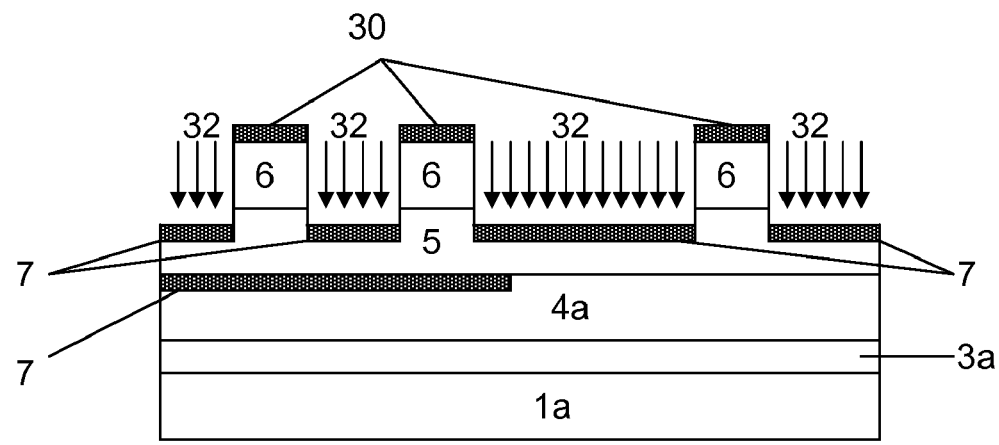
Figure 24G:
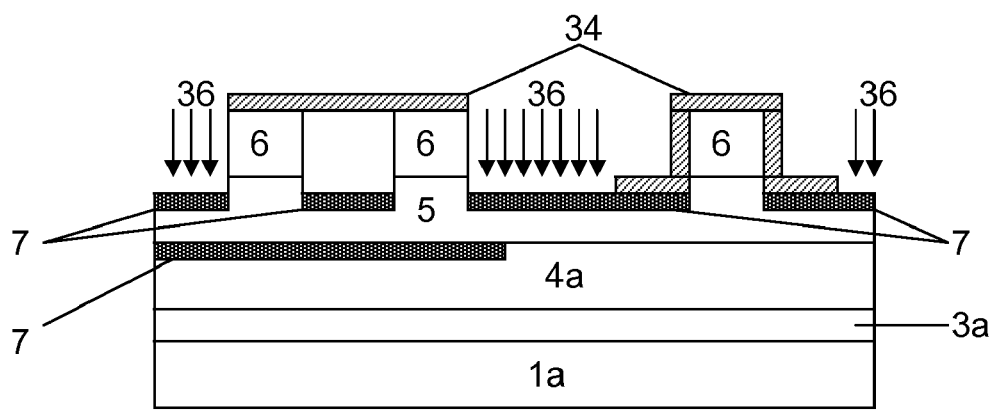
Figure 24H:
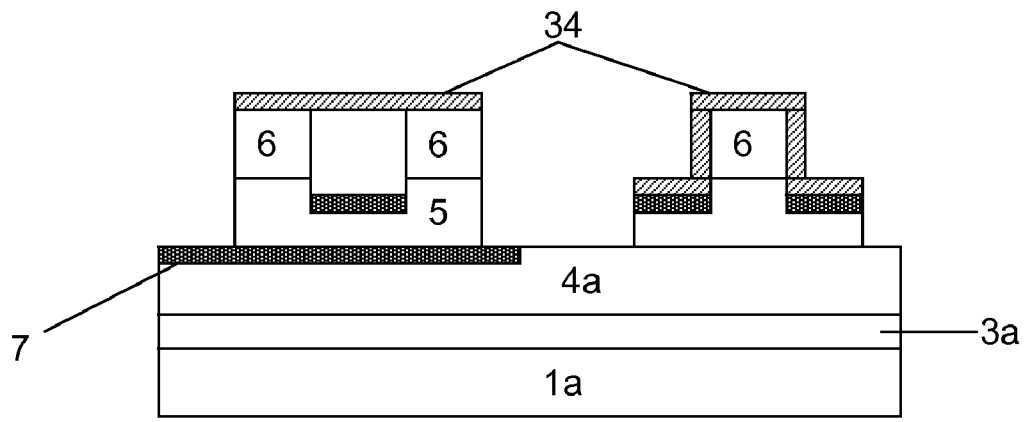
Figure 24I:
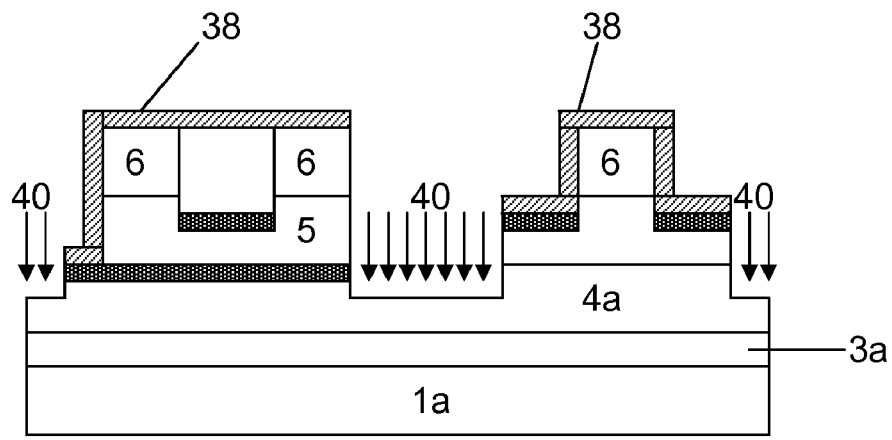
Figure 24J:
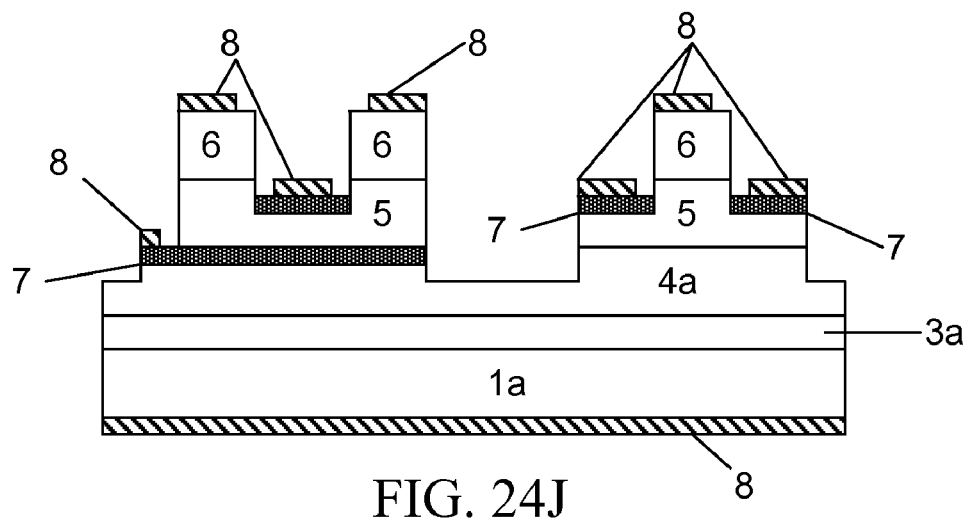

FIGS. 24A-24J illustrate a method of making a structure as shown in FIG. 15. FIG. 24A shows an n-type substrate (1a), an epitaxially grown n-type layer (3a) on substrate (1a), and an epitaxially grown n-type layer (4a) on layer (3a). An ion implantation mask (26) is also shown on the exposed upper surface of layer (4a). As shown in FIG. 24B, layer (4a) is selectively implanted with p-type donor atoms through mask (26) to form gate region (7). After removal of mask (26), an n-type epitaxial layer (5) and an n-type epitaxial layer (6) are successively grown on the implanted surface of layer (4a) as shown in FIGS. 24C and 24D. Etch mask (30) is then positioned on the exposed surface of layer (6) as shown in FIG. 24D followed by etching (31) through layer (6) and partially through underlying layer (5) (FIG. 24E). Exposed portions of layer (5) are then implanted (32) with p-type donor atoms through mask (30) to form additional gate regions (7) as shown in FIG. 24F. Etch mask (34) is then positioned on the surface of the etched and implanted structure and etching (36) results in selective removal of portions of layer (5) including portions of the p-type implanted gate regions (FIG. 24H). Exposed portions of layer (4a) are then etched (40) through mask (38) as shown in FIG. 24I. Ohmic contacts (8) are then formed on the etched and implanted structure to form the device as shown in FIG. 24J.

The epitaxially grown n-type layer (3a) shown in FIG. 24 is optional. This layer can be grown on the substrate to improve the quality of the epitaxially grown n-type layer (4a).

The method as outlined above can also be used to form a structure as shown in FIG. 16.

Figure 25A:
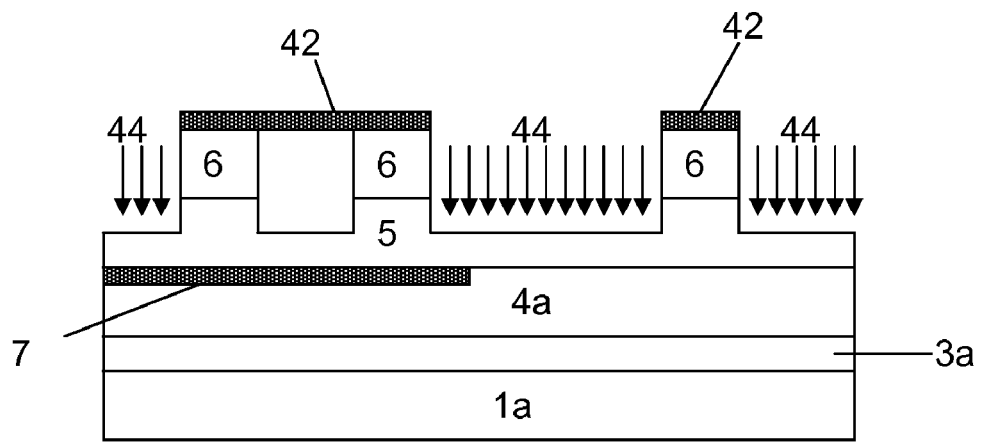
FIGS. 25A-25D illustrate a method of making a monolithic integrated circuit as set forth in FIG. 17.
Figure 25B:
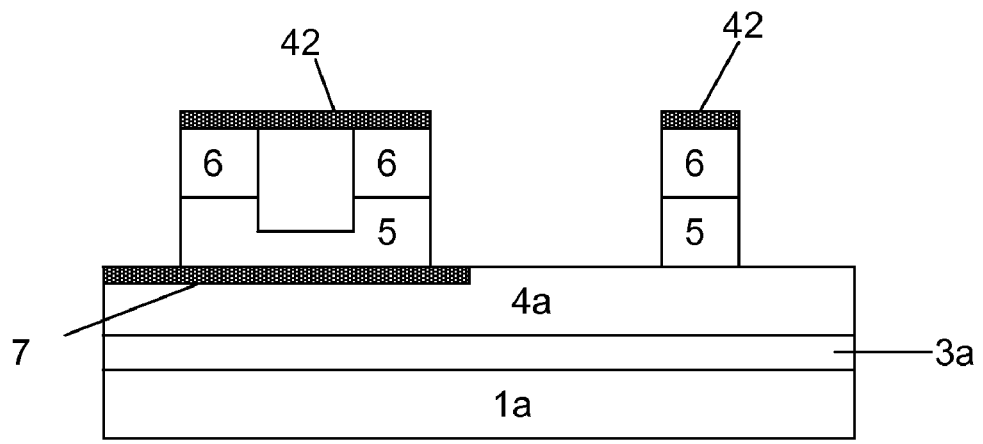
Figure 25C:
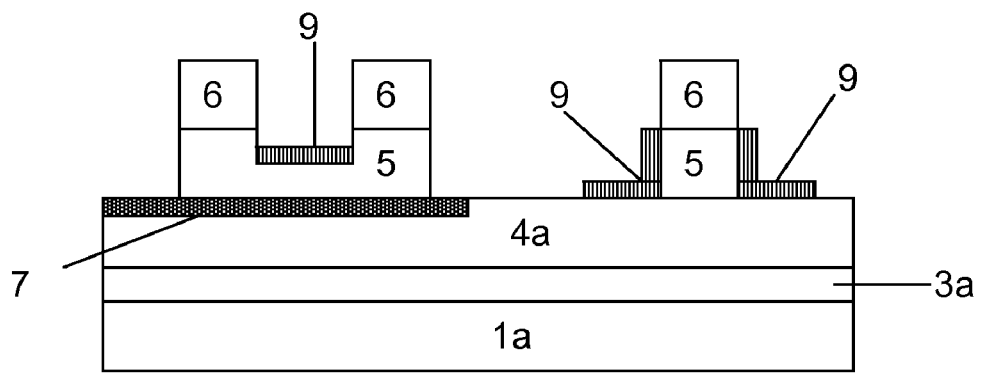
Figure 25D:
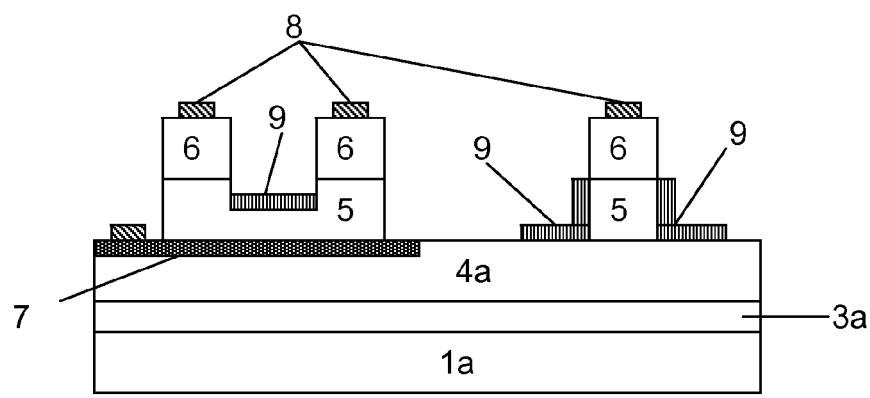

FIGS. 25A-25D illustrate a method of making a structure as shown in FIG. 17. As shown in FIG. 25A, a structure a shown in FIG. 24E is etched (44) through mask (42) to expose portions of underlying layer (4a) (FIG. 25B). Schottky contacts (9) are then formed on the etched/implanted structure as shown in FIG. 25C. The formation of ohmic contacts (8) results in the device as shown in FIG. 25D.

The epitaxially grown n-type layer (3a) shown in FIG. 25 is optional. This layer can be grown on the substrate to improve the quality of the epitaxially grown n-type layer (4a).

Figure 26A:
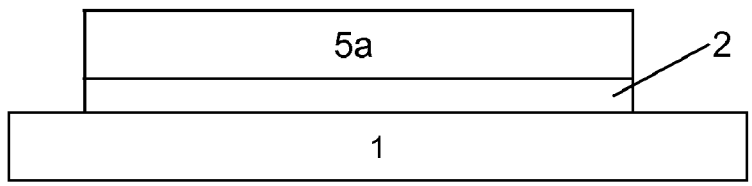
FIGS. 26A-26H illustrate a method of making a monolithic integrated circuit as set forth in FIG. 9.
Figure 26B:
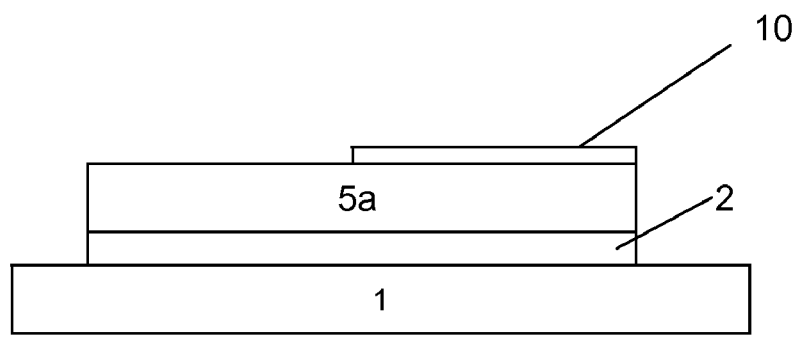
Figure 26C:
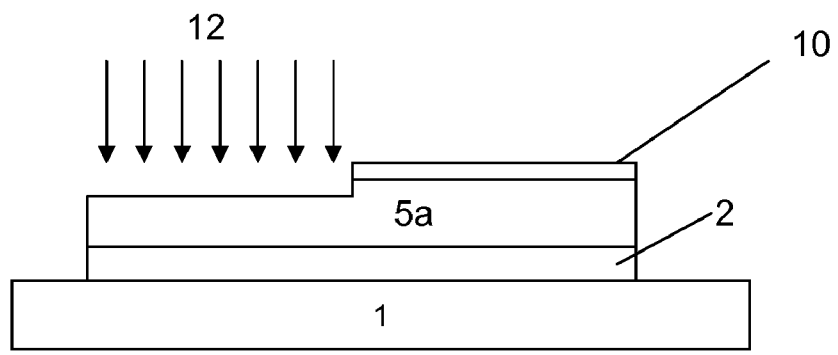
Figure 26D:
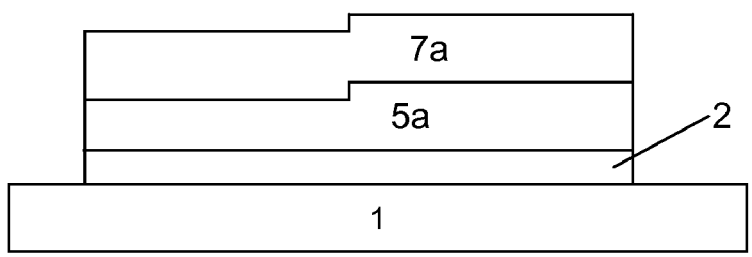
Figure 26E:
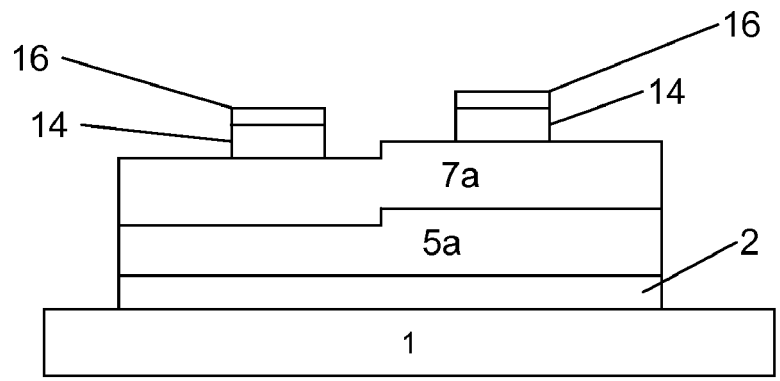
Figure 26F:
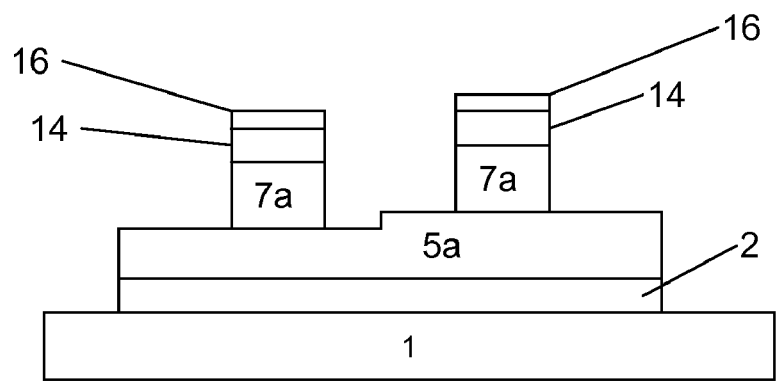
Figure 26G:
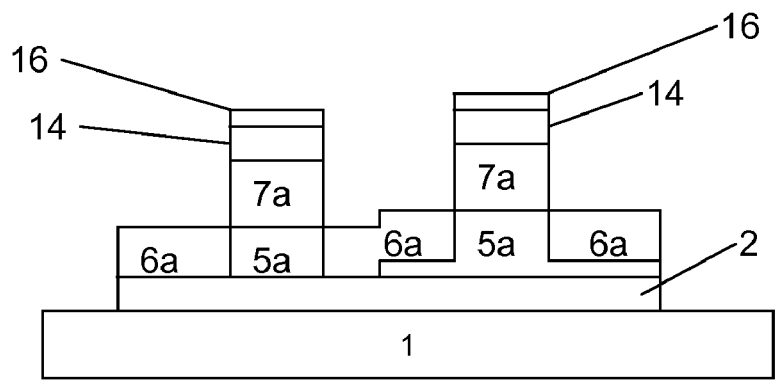
Figure 26H:
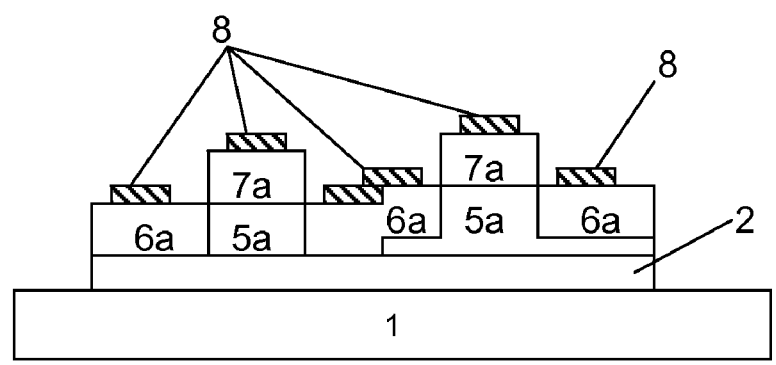

FIGS. 26A-26H illustrate a method of making a device as set forth in FIG. 9. FIG. 26A shows a multi-layer structure comprising a substrate (1), an epitaxially grown p-type layer (2) and an epitaxially grown n-type layer (5a). An etch mask (10) is positioned on the exposed surface of epitaxially grown n-type layer (5a) as shown in FIG. 26B. Epitaxially grown n-type layer (5a) is then selectively etched (12) as shown in FIG. 26C through opening in mask (10). Mask (10) is then removed and p-type layer (7a) is then epitaxially grown on the selectively etched n-type layer as shown in FIG. 26D. Ion implantation mask (14) and etch mask (16) are then placed on the p-type layer (7a). P-type layer (7a) is then selectively etched through openings in mask (14, 16) to expose underlying n-type layer (5a) as shown in FIG. 26F. Ion implantation of n-type dopants through openings in mask (14, 16) results in the formation of highly n-doped regions (6a) in epitaxially grown n-type layer (5a) as shown in FIG. 26G. Mask (14, 16) is then removed and ohmic contacts (8) are then formed on exposed surfaces of the raised p-type features (7a) and the implanted regions (6a) as shown in FIG. 26H.

Figure 27A:
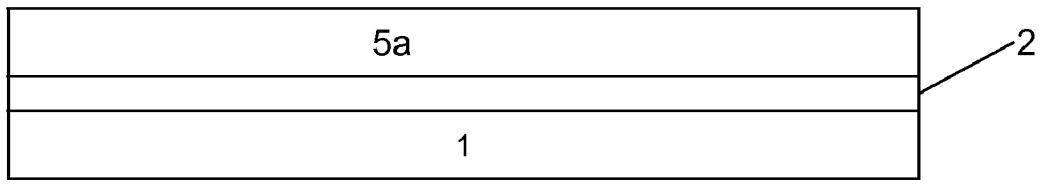
FIGS. 27A-27I illustrate a method of making a monolithic integrated circuit as set forth in FIG. 10.
Figure 27B:
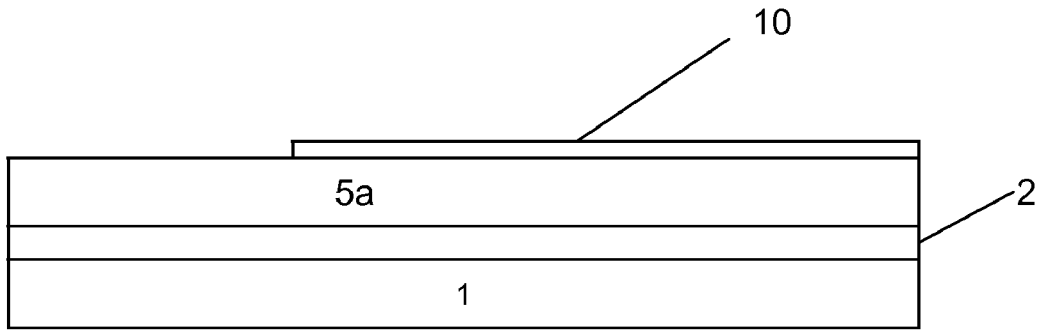
Figure 27C:
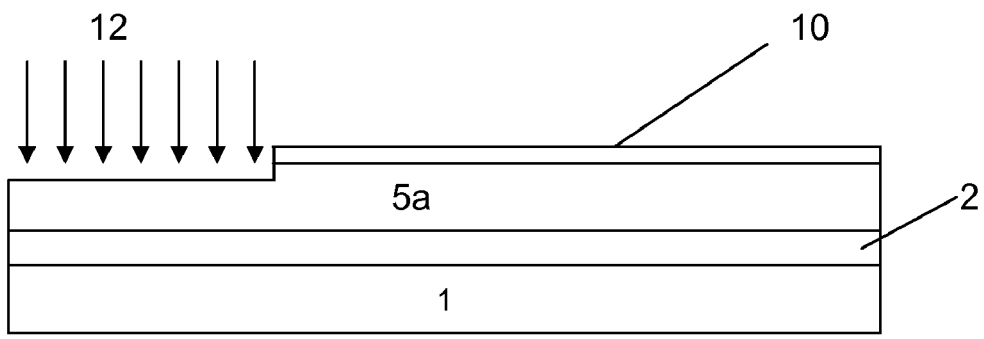
Figure 27D:
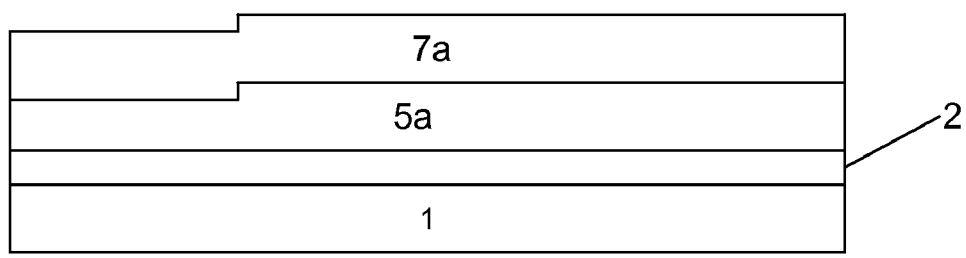
Figure 27E:
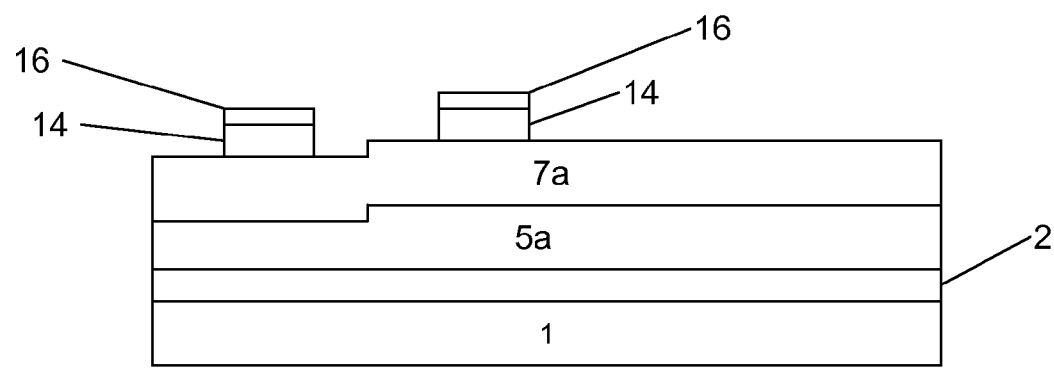
Figure 27F:
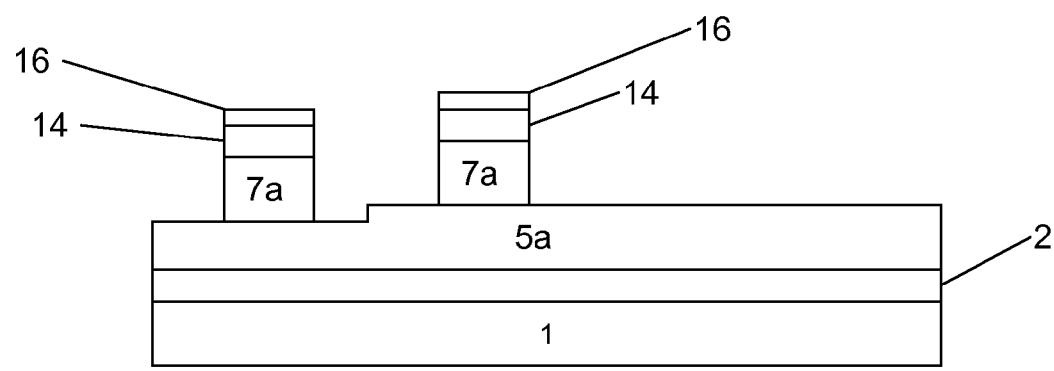
Figure 27G:
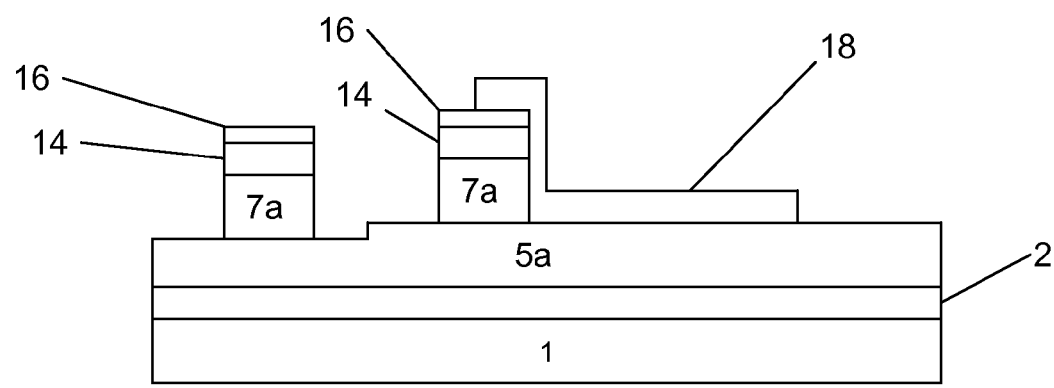
Figure 27H:
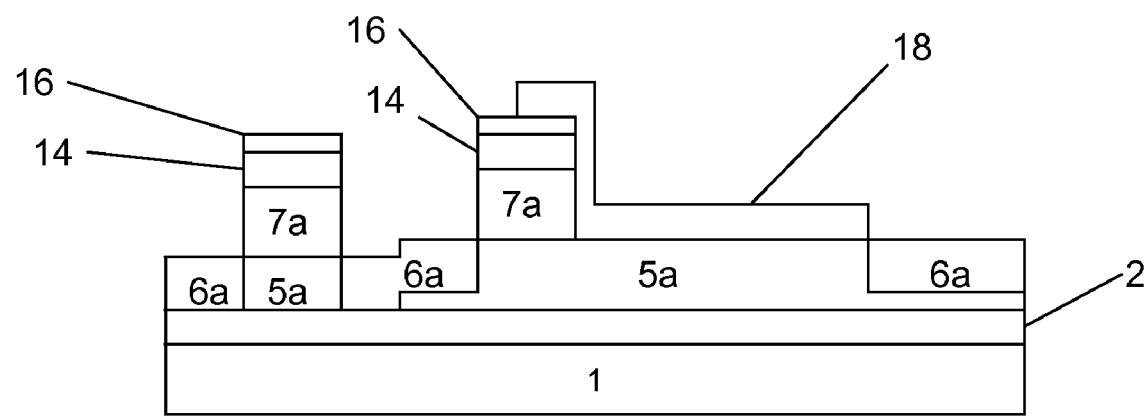
Figure 27I:
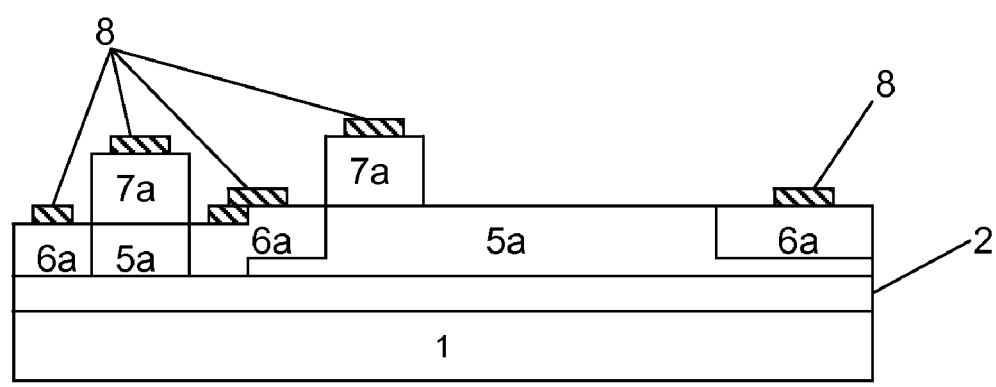

FIGS. 27A-27I illustrate a method of making a device as set forth in FIG. 10. FIG. 27A shows a multi-layer structure comprising a substrate (1), an epitaxially grown p-type layer (2) and an epitaxially grown n-type layer (5a). An etch mask (10) is positioned on the exposed surface of epitaxially grown n-type layer (5a) as shown in FIG. 27B. Epitaxially grown n-type layer (5a) is then selectively etched (12) as shown in FIG. 27C through opening in mask (10). Mask (10) is then removed and p-type layer (7a) is then epitaxially grown on the selectively etched n-type layer as shown in FIG. 27D. Ion implantation mask (14) and etch mask (16) are then placed on p-type layer (7a) as shown in FIG. 27E. P-type layer (7a) is then selectively etched through openings in mask (14, 16) to expose underlying n-type layer (5a) as shown in FIG. 27F. An additional ion implantation mask 18 is then positioned on n-type layer (5a) adjacent the raised p-type feature on the raised region of n-type layer (5a) opposite the etched region of n-type layer (5a) as shown in FIG. 27G. Ion implantation of n-type dopants through openings in mask (14, 16) and mask (18) results in the formation of highly n-doped regions (6a) in epitaxially grown n-type layer (5a) as shown in FIG. 27H. Mask (14, 16) and mask (18) are then removed and ohmic contacts (8) are then formed on exposed surfaces of the raised p-type features (7a) and the implanted regions (6a) as shown in FIG. 27I.

Although exemplary embodiments are discussed above, other alternative embodiments are also possible. For example, GaN n-type epitaxial layers can be grown on silicon carbide, sapphire, or silicon substrates to form a starting material stack for the fabrication of the proposed device structure. Alternatively, a substrate material comprising a conducting SiC substrate with a semi-insulating epitaxially grown buffer layer can be used as disclosed in U.S. patent application Ser. No. 10/033,785, filed Jan. 3, 2002 (published as U.S. Patent Publication No. 2002-0149021), now U.S. Pat. No. 7,009,209.

The SiC layers can be formed by doping the layers with donor or acceptor materials using known techniques. Exemplary donor materials include nitrogen and phosphorus. Nitrogen is a preferred donor material. Exemplary acceptor materials for doping SiC include boron and aluminum. Aluminum is preferred acceptor material. The above materials are merely exemplary, however, and any acceptor and donor materials which can be doped into silicon carbide can be used. The doping levels and thicknesses of the various layers of the LTJFETs, LJFETs and VJFETs described herein can be varied to produce a device having desired characteristics for a particular application. Similarly, the dimensions of the various features of the device can also be varied to produce a device having desired characteristics for a particular application.

The SiC layers can be formed by epitaxial growth on a suitable substrate. The layers can be doped during epitaxial growth.

While the foregoing specifications teach the principles of the present invention, with examples provided for the purpose of illustration, it will be appreciated by one skilled in the art from reading this disclosure that various changes in form and detail can be made without departing from the true scope of the invention.

CITED REFERENCES

1. W. Xie, et al., "Monolithic NMOS Digital Integrated Circuits in 6H-SiC," *IEEE Electron Device Letters, Vol.*: 15, No.: 11, Nov. 11, 1994, pp. 455-457.
2. D. M. Brown et al., "High temperature silicon carbide planar IC technology and first monolithic SiC operational amplifier IC," Transactions of $2^{nd}$ *Int. High-Temp. Elec. Conf (HiTEC)*, 1994, pp. XI-17-XI-22.
3. Slater, Jr. et al., "Silicon Carbide CMOS devices," U.S. Pat. No. 6,344,663, Feb. 5, 2002.
4. M. Bhatnagar et al., "Lateral MOSFET with modified field plates and damage areas," U.S. Pat. No. 5,710,455, Jan. 20, 1998.
5. I. Sankin et al., "On development of 6H-SiC LDMOS transistors using silane-ambient implant anneal," *Solid-State Electronics*, Vol. 45, No. 9, September, 2001, pp. 1653-165.
6. S. T. Sheppard et al., "High power hybrid and MMIC amplifiers using wide-bandgap semiconductor devices on semi-insulating SiC substrates," Digest of 60th Device Research Conference, 2002, Jun. 24-26, 2002, pp.: 175-178.
7. M. P. Lam, "Ion implant technology for 6H-SiC MESFETs digital ICs," Digest of 54th Annual Device Research Conference, 1996, Jun. 24-26, 1996, pp. 158-159.
8. Casady et al., "Complementary accumulation-mode JFET integrated circuit topology using wide (>2 eV) bandgap semiconductors," U.S. Pat. No. 6,503,782, Jan. 7, 2003.
9. J. N. Merrett et al., "Silicon Carbide Vertical Junction Field Effect Transistors Operated at Junction Temperatures Exceeding 300° C.", *Proceedings of IMAPS International Conference and Exhibition on High Temperature Electronics (HiTECH 2004)*, May 17-20, 2004, Sante Fe, N. Mex.
10. Sugawara et al., "Vertical field-effect semiconductor device with buried gate region," U.S. Pat. No. 6,600,192, Jul. 29, 2003.
11. Friedrichs et al., "Semiconductor construction with buried island region and contact region," U.S. Pat. No. 6,693,322, Feb. 17, 2004.
12. J. H. Zhao, "Double-gated vertical junction field effect power transistor," U.S. Published Patent Application 20030089930, May 15, 2003.
13. K. Asano et al., "5.5 kV normally-off low RonS 4H-SiC SEJFET," Power Semiconductor Devices and ICs, 2001. ISPSD '01. Proceedings of the 13th International Symposium on, 4-7 Jun. 2001, pp. 23-26.
14. Y. Sugawara et al., "4H-SiC high power SIJFET module," Power Semiconductor Devices and ICs, 2003. Proceedings, ISPSD '03. 2003 IEEE 15th International Symposium on, 14-17 Apr. 2003, pp. 127-130.
15. Berger et al., "Junction Field Effect Transistor Device for Replacing a Pentode," U.S. Pat. No. 3,767,946, Oct. 23, 1973.
16. Yoshida et al., "Compound Field Effect Transistor," U.S. Pat. No. 4,107,725, Aug. 15, 1978.
17. Baliga et al., "Composite Circuit for Power Semiconductor Switching", U.S. Pat. No. 4,663,547, May 5, 1987.
18. P. Friedrichs et al., "SiC power devices with low on-resistance for fast switching applications," Power Semiconductor Devices and ICs, 2000, Proceedings of the 12th International Symposium, May 22-25, 2000, pp. 213-216.

What is claimed is:

1. A semiconductor device made by a method comprising:
    positioning a first mask on a first layer of n-type semiconductor material, wherein the first layer is on a substrate;
    using the first mask, selectively implanting p-type dopants in the first layer of n-type semiconductor material to form a p-type implanted region adjacent a non-implanted region in the first layer;
    removing the first mask;
    epitaxially growing a third layer of n-type semiconductor material on the first layer;
    epitaxially growing a fourth layer of n-type semiconductor type material on the third layer;
    positioning a second mask on the fourth layer;
    selectively etching through the fourth layer to expose underlying third layer through openings in the second mask thereby forming raised features of n-type semiconductor material over the p-type implanted region of the first layer and one or more raised features of n-type semiconductor material over the non-implanted region of the first layer;

removing the second mask;

positioning a third mask which masks the raised features and the area between the raised features over the p-type implanted region of the first layer and which masks the raised feature over the non-implanted region of the first layer;

using the third mask, selectively etching through the third layer to expose p-type implanted and non-implanted regions of the underlying first layer thereby forming first and second raised structures, the first raised structure comprising the raised features over the p-type implanted region of the first layer and the region of the third layer therebetween and the second raised structure comprising the raised feature over the non-implanted region of the first layer, the second raised structure having sidewalls;

removing the third mask;

forming ohmic contacts on exposed surfaces of the raised features of n-type semiconductor material and on the exposed p-type implanted region of the first layer; and forming Schottky contacts on the third layer between the raised features over the p-type implanted region, on the non-implanted portion of the first layer adjacent the second raised structure and on material of the third layer on the sidewalls of the second raised structure.

2. A monolithic integrated circuit comprising a lateral junction field effect transistor and a vertical junction field effect transistor;

the lateral junction field effect transistor comprising:
a buffer layer of a p-type semiconductor material formed in a portion of a first major surface of a drift layer;
a channel layer of an n-type semiconductor material on and non-coextensive with the buffer layer such that a portion of the buffer layer is exposed;
discrete source and drain regions of an n-type semiconductor material in spaced relation on the channel layer;
a gate region of a p-type semiconductor material formed in the channel layer between the source and drain regions and forming a rectifying junction with the channel layer;
ohmic contacts on the source region, the gate region, the drain region and on the exposed portion of the buffer layer;
the vertical junction field effect transistor comprising:
a channel layer of an n-type semiconductor material on the first major surface of the drift layer laterally spaced from the buffer layer;
one or more discrete source regions of an n-type semiconductor material in spaced relation on the channel layer;
a gate region of a p-type semiconductor material formed in the channel layer adjacent the one or more source regions and forming a rectifying junction with the channel layer; and
ohmic contacts on the gate and source regions;
wherein the drift layer is on a first major surface of a substrate; and wherein an electrical contact is on a second major surface of the substrate opposite the first major surface of the substrate.

3. The integrated circuit of claim 2, wherein a drain layer of an n-type semiconductor material is between the drift layer and the first major surface of the substrate.

4. The integrated circuit of claim 2, further comprising:
a first electrical connection between the source contact of the lateral channel JFET and the gate contact of the vertical channel JFET;
a second electrical connection between the gate and buffer layer contacts of the lateral channel JFET; and
a third electrical connection between the drain contact of the lateral channel JFET and the source contact of the vertical channel JFET.

5. The integrated circuit of claim 2, further comprising one or more rings of p-type semiconductor material formed in the drift layer and circumscribing the lateral junction field effect transistor.

6. The integrated circuit of claim 2, further comprising one or more rings of p-type semiconductor material formed in the drift layer and circumscribing the vertical junction field effect transistor.

7. The integrated circuit of claim 2, wherein the semiconductor material of each of the drift layer, buffer layer, drain region, source region, gate region and channel layer has a bandgap ($E_G$) of at least 2 eV.

8. The integrated circuit of claim 2, wherein the semiconductor material of each of the drift layer, buffer layer, source region, gate region and channel layer is SiC or a Group III nitride compound semiconductor material.

9. A monolithic integrated circuit comprising a lateral junction field effect transistor and a vertical junction field effect transistor;

the lateral junction field effect transistor comprising:
a buffer layer of a p-type semiconductor material formed in a portion of a first major surface of a drift layer;
a channel layer of an n-type semiconductor material on and non-coextensive with the buffer layer such that a portion of the buffer layer is exposed;
discrete source and drain regions each of an n-type semiconductor material in spaced relation on the channel layer;
a metal layer on the channel layer between the source and drain regions forming a metal-semiconductor rectifying junction with the channel layer;
ohmic contacts on the source region, the drain region and on the exposed portion of the buffer layer;
the vertical junction field effect transistor comprising:
one or more raised regions on the first major surface of the drift layer laterally spaced from the buffer layer each comprising a channel region of an n-type semiconductor material on the first major surface of the drift layer and spaced from the buffer layer of the lateral junction field effect transistor and a source region of an n-type semiconductor material on the channel region;
a metal layer on the drift layer adjacent to the one or more raised regions forming a metal-semiconductor rectifying junction with the drift layer and the channel region (s); and
an ohmic contact on the source region;
wherein the drift layer is on a first major surface of a substrate; and wherein an electrical contact is on a second major surface of the substrate opposite the first major surface of the substrate.

10. The integrated circuit of claim 9, wherein a drain layer of an n-type semiconductor material is between the drift layer and the first major surface of the substrate.

11. The integrated circuit of claim 9, further comprising:
a first electrical connection between the source contact of the lateral junction field effect transistor and the metal layer of the vertical junction field effect transistor;
a second electrical connection between the metal layer and buffer contacts of the lateral junction field effect transistor; and a third electrical connection between the drain contact of the lateral junction field effect transistor and the source contact of the vertical junction field effect transistor.

12. The integrated circuit of claim 9, further comprising one or more rings of p-type semiconductor material formed in the drift layer and circumscribing the lateral junction field effect transistor.

13. The integrated circuit of claim 9, further comprising one or more rings of p-type semiconductor material formed in the drift layer and circumscribing the vertical junction field effect transistor.

14. The integrated circuit of claim 2, wherein the drift layer has a thickness of 5 to 350 μm and/or a dopant concentration of $2\times10^{14}$ to $2\times10^{16}$ cm$^{-3}$.

15. The integrated circuit of claim 2, wherein the substrate is an n-type substrate having a dopant concentration greater than $1\times10^{18}$ cm$^{-3}$.

16. The integrated circuit of claim 2, wherein for the lateral junction field effect transistor:
the channel region has a thickness of 0.2 to 1.5 μm;
the source region has a thickness of 0.2 to 1.5 μm; and
the gate region and buffer layer each have a thickness of 0.1 μm or more.

17. The integrated circuit of claim 2, wherein for the lateral junction field effect transistor:
the channel region has a dopant concentration of $5\times10^{15}$ to $5\times10^{17}$ cm$^{-3}$;
the source region has a dopant concentration greater than $5\times10^{18}$ cm$^{-3}$; and
the gate region and buffer layer each have a dopant concentration greater than $5\times10^{18}$ cm$^{-3}$.

18. The integrated circuit of claim 9, wherein the drift layer has a thickness of 5 to 350 μm and/or a dopant concentration of $2\times10^{14}$ to $2\times10^{16}$ cm$^{-3}$.

19. The integrated circuit of claim 9, wherein the substrate is an n-type substrate having a dopant concentration greater than $1\times10^{18}$ cm$^{-3}$.

20. The integrated circuit of claim 9, wherein for the lateral junction field effect transistor:
the channel region has a thickness of 0.2 to 1.5 μm;
the source region has a thickness of 0.2 to 1.5 μm; and
the gate region and buffer layer each have a thickness of 0.1 μm or more.

21. The integrated circuit of claim 9, wherein for the lateral junction field effect transistor:
the channel region has a dopant concentration of $5\times10^{15}$ to $5\times10^{17}$ cm$^{-3}$;
the source region has a dopant concentration greater than $5\times10^{18}$ cm$^{-3}$; and
the gate region and buffer layer each have a dopant concentration greater than $5\times10^{18}$ cm$^{-3}$.

22. The integrated circuit of claim 9, wherein the semiconductor material of each of the drift layer, buffer layer, drain region, source region, gate region and channel layer has a bandgap ($E_G$) of at least 2 eV.

23. The integrated circuit of claim 9, wherein the semiconductor material of each of the drift layer, buffer layer, source region, gate region and channel layer is SiC or a Group III nitride compound semiconductor material.

24. A semiconductor device made by a method comprising:
positioning a first mask on a first layer of n-type semiconductor material, wherein the first layer is on a substrate;
using the first mask, selectively implanting p-type dopants in the first layer to form a p-type implanted region adjacent a non-implanted region in the first layer;
removing the first mask;
epitaxially growing a third layer of n-type semiconductor material on the first layer;
epitaxially growing a fourth layer of n-type semiconductor type material on the third layer;
positioning a second mask on the fourth layer;
selectively etching through the fourth layer to expose underlying third layer through openings in the second mask thereby forming raised features of n-type semiconductor material over the p-type implanted region of the first layer and one or more raised features of n-type semiconductor material over the non-implanted region of the first layer;
implanting p-type dopants in the third layer through openings in the second mask to form p-type implanted regions in the third layer between and adjacent the raised features of n-type semiconductor material;
removing the second mask;
positioning a third mask which masks the raised features and the area between the raised features over the p-type implanted region of the first layer and which masks the one or more raised features over the non-implanted region of the first layer and areas adjacent thereto;
using the third mask, selectively etching through the third layer to expose p-type implanted and non-implanted regions of the underlying first layer thereby forming first and second raised structures, wherein the first raised structure comprises the raised features over the p-type implanted region of the first layer and the p-type implanted region of the third layer therebetween and wherein the second raised structure comprises the one or more raised features over the non-implanted region of the first layer and p-type implanted regions of the third layer adjacent thereto;
removing the third mask;
positioning a fourth mask covering the first and second raised structures and a region of p-type implanted first layer adjacent the first raised structure;
using the fourth mask, selectively etching through the p-type implanted region in the first layer of n-type semiconductor material adjacent to and between the first and second raised structures;
removing the fourth mask; and
forming ohmic contacts on exposed surfaces of the raised features of n-type semiconductor material and on exposed p-type implanted regions.

* * * * *